United States Patent
Sato

(10) Patent No.: US 7,791,957 B2
(45) Date of Patent: Sep. 7, 2010

(54) SEMICONDUCTOR INTEGRATED CIRCUIT AND METHOD OF ALLOCATING CODES

(75) Inventor: Takahiko Sato, Kawasaki (JP)

(73) Assignee: Fujitsu Semiconductor Limited, Yokohama (JP)

(*) Notice: Subject to any disclaimer, the term of this patent is extended or adjusted under 35 U.S.C. 154(b) by 221 days.

(21) Appl. No.: 12/136,453

(22) Filed: Jun. 10, 2008

(65) Prior Publication Data

US 2008/0304333 A1 Dec. 11, 2008

(30) Foreign Application Priority Data

Jun. 11, 2007 (JP) ............................. 2007-154220

(51) Int. Cl.
*G11C 7/10* (2006.01)
(52) U.S. Cl. .................. 365/189.05; 365/201
(58) Field of Classification Search ............ 365/189.05, 365/189.03, 201
See application file for complete search history.

(56) References Cited

U.S. PATENT DOCUMENTS 6,163,499 A * 12/2000 Suzuki .................. 365/230.06
6,711,082 B1 * 3/2004 Loffler ........................ 365/222
2003/0151962 A1 * 8/2003 Tomizawa et al. ........... 365/201

FOREIGN PATENT DOCUMENTS

JP 07-312098 A 11/1995

* cited by examiner

Primary Examiner—Anh Phung
(74) Attorney, Agent, or Firm—Arent Fox LLP

(57) ABSTRACT

A semiconductor integrated circuit includes a plurality of terminals, a first latch configured to, upon being uniquely specified by a first predetermined number of bits that are part of a plurality of bits entered through the terminals, store a second predetermined number of bits that are at least part of remaining bits left after excluding the first predetermined number of bits from the plurality of bits, and a second latch configured to, upon being uniquely specified by a third predetermined number of bits that are part of the plurality of bits entered through the terminals, store a fourth predetermined number of bits that are at least part of remaining bits left after excluding the third predetermined number of bits from the plurality of bits, wherein the first predetermined number is different from the third predetermined number, and the second predetermined number is different from the fourth predetermined number.

6 Claims, 23 Drawing Sheets

FIG.1

| FUNCTION NAME | OPTION | SubCode | | | MainCode | | | |
|---|---|---|---|---|---|---|---|---|
| | | A06 | A05 | A04 | A03 | A02 | A01 | A00 |
| VPP Trim | default | X | 0 | 0 | 0 | 0 | 0 | 0 |
| | +100mV | X | 0 | 1 | 0 | 0 | 0 | 0 |
| | -200mV | X | 1 | 0 | 0 | 0 | 0 | 0 |
| | -100mV | X | 1 | 1 | 0 | 0 | 0 | 0 |
| VBB Trim | default | X | 0 | 0 | 0 | 0 | 0 | 1 |
| | +100mV | X | 0 | 1 | 0 | 0 | 0 | 1 |
| | -200mV | X | 1 | 0 | 0 | 0 | 0 | 1 |
| | -100mV | X | 1 | 1 | 0 | 0 | 0 | 1 |
| VBLEQ Trim | default | 0 | 0 | 0 | 0 | 0 | 1 | 0 |
| | +050mV | 0 | 0 | 1 | 0 | 0 | 1 | 0 |
| | +100mV | 0 | 1 | 0 | 0 | 0 | 1 | 0 |
| | +150mV | 0 | 1 | 1 | 0 | 0 | 1 | 0 |
| | -200mV | 1 | 0 | 0 | 0 | 0 | 1 | 0 |
| | -150mV | 1 | 0 | 1 | 0 | 0 | 1 | 0 |
| | -100mV | 1 | 1 | 0 | 0 | 0 | 1 | 0 |
| | -050mV | 1 | 1 | 1 | 0 | 0 | 1 | 0 |
| VPL Trim | default | X | 0 | 0 | 0 | 0 | 1 | 1 |
| | +100mV | X | 0 | 1 | 0 | 0 | 1 | 1 |
| | -200mV | X | 1 | 0 | 0 | 0 | 1 | 1 |
| | -100mV | X | 1 | 1 | 0 | 0 | 1 | 1 |
| VPP External Supply | | X | X | X | 0 | 1 | 0 | 0 |
| VBB External Supply | | X | X | X | 0 | 1 | 0 | 1 |
| VBLEQ ExternalSupply | | X | X | X | 0 | 1 | 1 | 0 |
| VPL External Supply | | X | X | X | 0 | 1 | 1 | 1 |
| wl-sae Trim | default | X | 0 | 0 | 1 | 0 | 0 | 0 |
| | +2ns | X | 0 | 1 | 1 | 0 | 0 | 0 |
| | +4ns | X | 1 | 0 | 1 | 0 | 0 | 0 |
| | -2ns | X | 1 | 1 | 1 | 0 | 0 | 0 |
| DQ Compression | | X | X | X | 1 | 0 | 0 | 1 |
| Bank Compression | | X | X | X | 1 | 0 | 1 | 0 |

FIG.2

| FUNCTION NAME | OPTION | UNUSED | | SubCode | | | MainCode | |
|---|---|---|---|---|---|---|---|---|
| | | A06 | A05 | A04 | A03 | A02 | A01 | A00 |
| VBLEQ Trim | default | X | X | 0 | 0 | 0 | 1 | 1 |
| | +050mV | X | X | 0 | 0 | 1 | 1 | 1 |
| | +100mV | X | X | 0 | 1 | 0 | 1 | 1 |
| | +150mV | X | X | 0 | 1 | 1 | 1 | 1 |
| | -200mV | X | X | 1 | 0 | 0 | 1 | 1 |
| | -150mV | X | X | 1 | 0 | 1 | 1 | 1 |
| | -100mV | X | X | 1 | 1 | 0 | 1 | 1 |
| | -050mV | X | X | 1 | 1 | 1 | 1 | 1 |
| VPP Trim | default | X | X | 0 | 0 | 1 | 0 | 1 |
| | +100mV | X | X | 0 | 1 | 1 | 0 | 1 |
| | -200mV | X | X | 1 | 0 | 1 | 0 | 1 |
| | -100mV | X | X | 1 | 1 | 1 | 0 | 1 |
| VBB Trim | default | X | X | 0 | 0 | 0 | 0 | 1 |
| | +100mV | X | X | 0 | 1 | 0 | 0 | 1 |
| | -200mV | X | X | 1 | 0 | 0 | 0 | 1 |
| | -100mV | X | X | 1 | 1 | 0 | 0 | 1 |
| VPL Trim | default | X | X | 0 | 0 | 1 | 0 | 0 |
| | +100mV | X | X | 0 | 1 | 1 | 0 | 0 |
| | -200mV | X | X | 1 | 0 | 1 | 0 | 0 |
| | -100mV | X | X | 1 | 1 | 1 | 0 | 0 |
| wl-sae Trim | default | X | X | 0 | 0 | 0 | 0 | 0 |
| | +2ns | X | X | 0 | 1 | 0 | 0 | 0 |
| | +4ns | X | X | 1 | 0 | 0 | 0 | 0 |
| | -2ns | X | X | 1 | 1 | 0 | 0 | 0 |
| VPP External Supply | | X | X | 1 | 1 | 1 | 1 | 0 |
| VBB External Supply | | X | X | 0 | 1 | 1 | 1 | 0 |
| VBLEQ External Supply | | X | X | 1 | 0 | 1 | 1 | 0 |
| VPL External Supply | | X | X | 0 | 0 | 1 | 1 | 0 |
| DQ Compression | | X | X | 1 | 1 | 0 | 1 | 0 |
| Bank Compression | | X | X | 0 | 1 | 0 | 1 | 0 |

FIG.5A

| A11 | A10 | A09 | A08 | A07 | A06 | A05 | A04 | A03 | A02 | A01 | A00 |
|-----|-----|-----|-----|-----|-----|-----|-----|-----|-----|-----|-----|
| Group | | | MRS | Entry/Exit | Sub | | | | | | |
| 1 | 1 | x | 1 | 1 | x | x | x | x | x | x | x |

FIG.5B

| A11 | A10 | A09 | A08 | A07 | A06 | A05 | A04 | A03 | A02 | A01 | A00 |
|-----|-----|-----|-----|-----|-----|-----|-----|-----|-----|-----|-----|
| Group | | | MRS | Entry/Exit | Sub | | | | | Main | |
| 1 | 0 | x | 1 | 1 | x | x | x | x | x | x | x |

FIG.5C

| A11 | A10 | A09 | A08 | A07 | A06 | A05 | A04 | A03 | A02 | A01 | A00 |
|---|---|---|---|---|---|---|---|---|---|---|---|
| Group | | | MRS | Entry/Exit | Sub | Main | | | | | |
| 1 | 0 | 0 | 1 | 1 | x | x | x | x | x | x | x |

FIG.5D

| A11 | A10 | A09 | A08 | A07 | A06 | A05 | A04 | A03 | A02 | A01 | A00 |
|---|---|---|---|---|---|---|---|---|---|---|---|
| Group | | | MRS | Entry/Exit | Sub | NoUse | | Main | | | |
| 0 | 1 | 1 | 1 | 1 | x | x | x | x | x | x | x |

FIG.5E

| A11 | A10 | A09 | A08 | A07 | A06 | A05 | A04 | A03 | A02 | A01 | A00 |
|---|---|---|---|---|---|---|---|---|---|---|---|
| Group | | | MRS | Entry/Exit | NoUse | NoUse | | Main | | | |
| 0 | 0 | x | 1 | 1 | x | x | x | x | x | x | x |

FIG.11

| | LenSub | CountMain | LenCode | LenCodeRest |
|---|---|---|---|---|
| Group[7] | 7 | 2 | 11 | 0 |
| Group[5] | 5 | 4 | 10 | 1 |
| Group[3] | 3 | 14 | 10 | 1 |
| Group[2] | 2 | 13 | 9 | 2 |
| Group[0] | 0 | 32 | 8 | 3 |

LenCodeUse= 11
CountGroup= 5

FIG.12

| | C10 | C09 | C08 | C07 | C06 | C05 | C04 | C03 | C02 | C01 | C00 |
|---|---|---|---|---|---|---|---|---|---|---|---|
| Group[7] | Cgroup | | | Cmain | | | | | | | Csub |
| Group[5] | Cgroup | | | Cex | Cmain | | | | | | Csub |
| Group[3] | Cgroup | | | Cex | Cmain | | | | | | Csub |
| Group[2] | Cgroup | | | Cex | | Cmain | | | | | Csub |
| Group[0] | Cgroup | | | Cex | | | Cmain | | | | |
| | Cgroup | | | | | | | | | | |
| | Cgroup | | | | | | | | | | |
| | Cgroup | | | | | | | | | | |

FIG. 13

| | C10 | C09 | C08 | C07 | C06 | C05 | C04 | C03 | C02 | C01 | C00 |
|---|---|---|---|---|---|---|---|---|---|---|---|
| Group[7] | 1 | 1 | 1 | 1 Cmain | | | | | | | Csub |
| Group[5] | 1 | 1 | 1 | 0 Cex | Cmain | | | | | | Csub |
| Group[3] | 1 | 1 | 0 | 1 Cex | Cmain | | | | | | Csub |
| Group[2] | 1 | 0 | 0 | 0 Cex | | Cmain | | | | | Csub |
| Group[0] | 0 | 1 | 1 | 1 Cex | | | Cmain | | | | |
| | 0 | 0 | 0 | 0 | | | | | | | |
| | 0 | 0 | 1 | 0 | | | | | | | |
| | 0 | 0 | 0 | 0 | | | | | | | |

FIG. 14

| | C10 | C09 | C08 | C07 | C06 | C05 | C04 | C03 | C02 | C01 | C00 |
|---|---|---|---|---|---|---|---|---|---|---|---|
| Group[7] | 1 | 1 | 1 | 1 Cmain | | | | | | | Csub |
| Group[5] | 1 | 1 | 1 | 0 | 1 Cmain | | | | | | Csub |
| Group[3] | 1 | 1 | 0 | 1 | 0 Cmain | | | | | | Csub |
| Group[2] | 1 | 0 | 0 | 0 | | Cmain | | | | | Csub |
| Group[0] | 0 | 1 | 1 | 1 | | | Cmain | | | | |
| | 0 | 0 | 0 | 0 | | | | | | | |
| | 0 | 0 | 1 | 0 | | | | | | | |
| | 0 | 0 | 0 | 0 | | | | | | | |

FIG.15

| | C10 | C09 | C08 | C07 | C06 | C05 | C04 | C03 | C02 | C01 | C00 |
|---|---|---|---|---|---|---|---|---|---|---|---|
| Group[7] | 1 | 1 | 1 | Cmain | | | | | | | Csub |
| Group[5] | 1 | 1 | 0 | 1 | Cmain | | | | | | Csub |
| Group[3] | 1 | 1 | 0 | 0 | Cmain | | | | | | Csub |
| Group[2] | 1 | 0 | 0 | 0 | | Cmain | | | | | Csub |
| Group[0] | 0 | 1 | 1 | 0 | | | Cmain | | | | |
| | 0 | 0 | 0 | | | | | | | | |
| | 0 | 0 | 1 | | | | | | | | |
| | 0 | 0 | 0 | | | | | | | | |

FIG.16

| | C10 | C09 | C08 | C07 | C06 | C05 | C04 | C03 | C02 | C01 | C00 |
|---|---|---|---|---|---|---|---|---|---|---|---|
| Group[7] | 1 | 1 | 1 | Cmain | | | | | | | Csub |
| Group[5] | 1 | 1 | 0 | 1 | Cmain | | | | | | Csub |
| Group[3] | 1 | 1 | 0 | 0 | Cmain | | | | | | Csub |
| Group[2] | 1 | 0 | 0 | 1 | x | Cmain | | | | | Csub |
| Group[0] | 1 | 0 | 0 | 0 | x | x | Cmain | | | | |
| | 0 | 1 | 0 | | | | | | | | |
| | 0 | 0 | 1 | | | | | | | | |
| | 0 | 0 | 0 | | | | | | | | |

FIG.17

| | C10 | C09 | C08 | C07 | C06 | C05 | C04 | C03 | C02 | C01 | C00 |
|---|---|---|---|---|---|---|---|---|---|---|---|
| Group[7] | | 1 | 1 | 1 | Cmain | | | | | | Csub |
| Group[5] | | 1 | 0 | 1 | Cmain | | | | | | Csub |
| Group[3] | | 1 | 0 | 0 | Cmain | | | | | | Csub |
| Group[2] | | 0 | 0 | 1 | 1 | Cmain | | | | | Csub |
| Group[0] | | 0 | 0 | 1 | 0 | x | Cmain | | | | |
| | | 0 | 0 | 0 | | | | | | | |

FIG.18

| | C10 | C09 | C08 | C07 | C06 | C05 | C04 | C03 | C02 | C01 | C00 |
|---|---|---|---|---|---|---|---|---|---|---|---|
| Group[7] | | 1 | 1 | 1 | Cmain | | | | | | Csub |
| Group[5] | | 1 | 0 | 1 | Cmain | | | | | | Csub |
| Group[3] | | 1 | 0 | 0 | Cmain | | | | | | Csub |
| Group[2] | | 0 | 0 | 1 | Cmain | | | x | | | Csub |
| Group[0] | | 0 | 0 | 1 | 0 | Cmain | | | x | x | x |
| | | 0 | 0 | 0 | | | | | | | |

FIG. 19

| | C10 | C09 | C08 | C07 | C06 | C05 | C04 | C03 | C02 | C01 | C00 |
|---|---|---|---|---|---|---|---|---|---|---|---|
| Group[7] | 1 | 1 | 1 | Cmain | | | | | | | Csub |
| Group[5] | 1 | 1 | 0 | 1 | Cmain | | | | | | Csub |
| Group[3] | 1 | 1 | 0 | 0 | Cmain | | | | | | Csub |
| Group[2] | 0 | 0 | 1 | 1 | Cmain | | | | | | Csub |
| Group[0] | 0 | 0 | 0 | 1 | Cmain | | | | x | x | x |
| Group[0] | 0 | 0 | 0 | 0 | Cmain | | | | x | x | x |

FIG. 20

| | C10 | C09 | C08 | C07 | C06 | C05 | C04 | C03 | C02 | C01 | C00 |
|---|---|---|---|---|---|---|---|---|---|---|---|
| Group[7] | 1 | 1 | 1 | Cmain | | | | | | | Csub |
| Group[5] | 1 | 1 | 0 | 1 | Cmain | | | | | | Csub |
| Group[3] | 1 | 1 | 0 | 0 | Cmain | | | | | | Csub |
| Group[2] | 0 | 0 | 1 | 1 | Cmain | | Cmain | | x | | Csub |
| Group[0] | 0 | 0 | 0 | 1 | Cmain | | Cmain | | x | x | x |
| Group[0] | 0 | 0 | 0 | 0 | Cmain | | Cmain | | x | x | x |

FIG.21

| Ax1 | Ax0 | BA1 | BA0 | A11 | A10 | A09 | A08 | A07 | A06 | A05 | A04 | A03 | A02 | A01 | A00 |
|-----|-----|-----|-----|-----|-----|-----|-----|-----|-----|-----|-----|-----|-----|-----|-----|
| Sub | | | | | | | MRS | Entry/Exit | Main | | | | | | |

FIG.22

| A08 | A07 | A06 | A05 | A04 | A03 | A02 | A01 | A00 |
|---|---|---|---|---|---|---|---|---|
| MRS | Entry/Exit | Main | | | | | | |
| MRS | Entry/Exit | Sub | | | | | | |

SEMICONDUCTOR INTEGRATED CIRCUIT AND METHOD OF ALLOCATING CODES

CROSS-REFERENCE TO RELATED APPLICATIONS

The present application is based upon and claims the benefit of priority from the prior Japanese Patent Application No. 2007-154220 filed on Jun. 11, 2007, with the Japanese Patent Office, the entire contents of which are incorporated herein by reference.

BACKGROUND OF THE INVENTION

1. Field of the Invention

The disclosures herein generally relate to semiconductor integrated circuits, and particularly relate to a semiconductor integrated circuit provided with registers for setting codes that specify functions and a method of allocating such codes.

2. Description of the Related Art

In semiconductor devices, generally, a code specifying a particular operation is entered from an external source to cause a semiconductor device to perform the operation specified by the entered code. In a semiconductor memory device, for example, a code specifying a test operation is entered from outside by using all or part of the bits for supplying address signals, thereby causing the semiconductor memory device to perform a test operation specified by the entered code. Japanese Patent Application Publication No. 07-312098 discloses this art.

SUMMARY OF THE INVENTION

According to one embodiment, a semiconductor integrated circuit includes a plurality of terminals, a first latch configured to, upon being uniquely specified by a first predetermined number of bits that are part of a plurality of bits entered through the plurality of terminals, store a second predetermined number of bits that are at least part of remaining bits left after excluding the first predetermined number of bits from the plurality of bits, and a second latch configured to, upon being uniquely specified by a third predetermined number of bits that are part of the plurality of bits entered through the plurality of terminals, store a fourth predetermined number of bits that are at least part of remaining bits left after excluding the third predetermined number of bits from the plurality of bits, wherein the first predetermined number is different from the third predetermined number, and the second predetermined number is different from the fourth predetermined number.

BRIEF DESCRIPTION OF THE DRAWINGS

Other objects and further features of the present invention will be apparent from the following detailed description when read in conjunction with the accompanying drawings, in which:

FIG. 1 is a drawing showing an example of test functions of a semiconductor memory device and the relationships between option settings and code values;

FIG. 2 is a drawing showing an example of test functions of a semiconductor memory device and the relationships between option settings and code values;

FIG. 5A is a drawing showing an example of allocation of a main code and sub-code with respect to a function requiring a 7-bit code for discriminating different options provided in each function;

FIG. 5B is a drawing showing an example of allocation of a main code and sub-code with respect to a function requiring a 5-bit code for discriminating different options provided in each function;

FIG. 5C is a drawing showing an example of allocation of a main code and sub-code with respect to a function requiring a 3-bit code for discriminating different options provided in each function;

FIG. 5D is a drawing showing an example of allocation of a main code and sub-code with respect to a function requiring a 2-bit code for discriminating different options provided in each function;

FIG. 5E is a drawing showing an example of allocation of a main code and sub-code with respect to a function requiring a 0-bit code for discriminating different options provided in each function;

FIG. 11 is a table showing the groups and computed values determined by performing the steps shown in FIG. 10A;

FIG. 12 is a drawing showing the allocation of each code area obtained for each group according to step S8 with respect to the example shown in FIG. 11;

FIG. 13 is a drawing showing the allocation of bit patterns for uniquely identifying all the groups according to step S9;

FIG. 14 is a drawing showing the allocation of Cex to groups having small LenCodeRest according to step S10;

FIG. 15 is a drawing showing the same bit pattern for Cgroup that is reassigned to Group[3] and Group[5];

FIG. 16 is a drawing showing further allocation of Cex according to step S10;

FIG. 17 is a drawing showing the reallocation of bit patterns after the reduction of numbers of bits for Cgroup according to step S12;

FIG. 18 is a drawing showing the state after moving the unallocated bits of Cex to between Cmain and Csub according to step S13;

FIG. 19 is a drawing showing the state after performing the process of step S15;

FIG. 20 is a drawing showing the state after performing the process of step S16;

FIG. 21 is a drawing showing an example of allocation of terminals to a 7-bit main code and a 7-bit sub-code;

FIG. 22 is a drawing showing an example of allocation of codes to terminals when a main code and a sub-code are entered in two steps;

DESCRIPTION OF THE PREFERRED EMBODIMENTS

Figure 3:
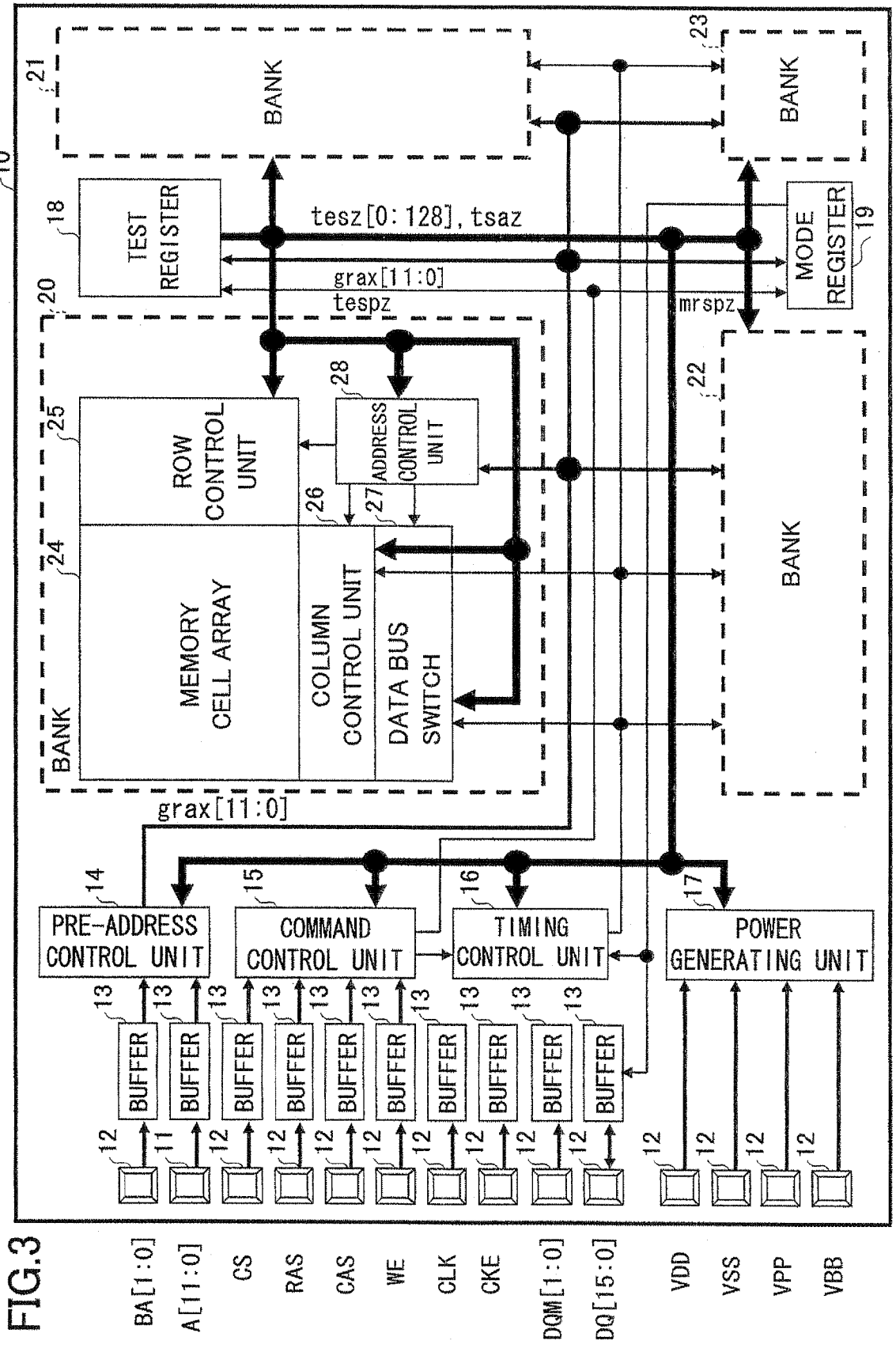
FIG. 3 is a drawing showing an example of the configuration of a semiconductor memory device.

In specifying a desired operation by use of a code, a two step code allocation scheme may be used that specifies a desired function and further specifies an option with respect to the specified function. For example, with respect to a test function that adjusts a word-line activation voltage of a semiconductor memory device, one of the available options is selected to specify the use of a default voltage, the use of a voltage that is 100-mV higher than the default voltage, or the use of a voltage that is 100-mV lower than the default voltage. The word-line activation voltage is then set to the selected voltage. A code that specifies a test function is referred to as a main code, and a code that specifies an option is referred to as a sub-code.

FIG. 1 is a drawing showing an example of test functions of a semiconductor memory device and the relationships between option settings and code values. In FIG. 1, VPPTrim indicates a test function for adjusting a word-line activation voltage VPP, VBBTrim indicating a test function for adjusting a back bias VBB of memory cells, VBLEQTrim indicating a test function for adjusting an equalize level, and VPLTrim indicating a test function for adjusting a plate potential of memory cells. VPP external supply, VBB external supply, etc., refer to test functions for applying respective voltages from an external source. Further, wl-saeTrim indicates a test function for adjusting a sense-amplifier activation timing. Moreover, DQ Compression and Bank Compression refer to functions for performing tests by compressing data and address, respectively.

These test functions are specified by a main code (MainCode) assigned to address bits A03 through A00. The setting of a main code to "0001", for example, specifies the VBBTrim function.

An option for a test function is selected by use of a sub-code (SubCode) assigned to address bits A06 through A04. For example, the VBBTrim function is specified by the main code "0001", and, then, the back bias VBB is set to a default voltage by setting the sub-code to "000". If the sub-code is set to "001", for example, the back bias VBB is set to a voltage that is 100-mV higher than the default voltage.

The setting of test function and option as described above is performed with respect to test registers provided in a semiconductor memory device in accordance with entered main code and sub-code. Specifically, latches (registers) are provided in one-to-one correspondence to test functions. When a main code specifying a test function and a sub-code specifying an option are entered, the latch specified by decoding the entered main code stores the value of the entered sub-code. With such hardware configuration, two or more test functions can simultaneously be selected while preventing more than one option to be specified with respect to any test function.

In semiconductor devices, the numbers of input/output pins are limited. It is thus inevitable that the number of pins assignable to the above-described main code and sub-code is limited. In the case of an SDRAM for which RAS/CAS addresses are multiplexed, the number of address terminals is 12 if the column address is 8 bits and the row address is 12 bits. Assuming that 2 terminals are already used for the purpose of selecting a test mode and specifying the entry/exit of test mode, only 10 terminals can be used for the purpose of specifying the codes.

When the number of terminals available for specifying codes is limited as in this case, it becomes difficult to provide a desired number of test functions and a desired number of options. If 64 different options are provided for a given test function, 6 bits need to be assigned for the purpose of specifying a sub-code. In this case, the number of remaining bits (terminals) available for allocation to a main code is 4. Namely, up to 16 test functions can only be specified.

Accordingly, there is a need for a method of allocating codes that can specify as many functions as possible and as many options as possible within the limitations posed by the limited number of bits. There is also a need for an semiconductor integrated circuit that has setting registers having hardware configuration suitable for such code allocation.

In the following, embodiments of the present invention will be described with reference to the accompanying drawings. The present invention will be described by using an example in which a test function is set for a semiconductor memory device. Nonetheless, the present invention is not limited to the setting of test function with respect to a semiconductor memory device. It should be noted that the present invention is applicable to setting of any operation and/or function by use of registers with respect to a semiconductor integrated circuit.

FIG. 2 is a drawing showing an example of test functions of a semiconductor memory device and the relationships between option settings and code values. In FIG. 2, test functions such as VPPTrim are the same as those described in connection with FIG. 1. A test function is specified by a main code (MainCode), and an option for a test function is specified by a sub-code (SubCode). The number of bits of the main code and the number of bits of the sub-code are designed to vary and be different for different functions according to need. With such variation in the number of bits of the main code and the number of bits of the sub-code, a relatively small number of bits are sufficient to specify a desired number of test functions and a desired number of options.

The setting of address bits A04 through A00 to "00111", for example, specifies the "+050 mV" option of the VBLEQTrim function. In this case, two bits A01 and A00 constitute a main code. The fact that these two bits are "11" uniquely identifies the VBLEQTrim function. Further, three bits A04 through A02 constitute a sub-code. The fact that these three bits are "001" uniquely identifies the "+050 mV" option. For the VBLEQTrim function, there are 8 different options, which require three bits for a sub-code to specify an option.

The setting of address bits A04 through A00 to "00101", for example, specifies the default voltage option of the VPPTrim function. In this case, three bits A02 through A00 constitute a main code. The fact that these three bits are "101" uniquely identifies the VPPTrim function. Further, two bits A04 through A03 constitute a sub-code. The fact that these two bits are "00" uniquely identifies the default voltage option. For the VPPTrim function, there are 4 different options, which require 2 bits for a sub-code to specify an option.

The setting of address bits A04 through A00 to "11110", for example, specifies the VPP external supply function. In this case, all the five bits A04 through A00 constitute a main code. The fact that these five bits are "11110" uniquely identifies the VPP external supply function. For the VPP external supply function, no different options are provided (there is only one option), which require 0 bit for a sub-code to specify an option.

In the case of the related-art code allocation scheme shown in FIG. 1, seven bits A00 through A06 are used as codes. In the case of the code allocation scheme shown in FIG. 2, on the other hand, five bits A00 through A04 are used as codes. The code allocation scheme shown in FIG. 2 uses only five bits as codes, yet is able to specify as many test functions and options as there are in the related art allocation scheme that uses seven bits. A method of allocating codes that achieves such code allocation will later be described in detail.

The setting of test function and option as described above is performed with respect to test registers provided in a semiconductor memory device in accordance with entered main code and sub-code. Specifically, latches (registers) are provided in one-to-one correspondence to test functions. When a main code specifying a test function and a sub-code specifying an option are entered, the latch specified by decoding the entered main code stores the value of the entered sub-code. With such hardware configuration, two or more test functions can simultaneously be selected while preventing more than one option to be specified with respect to any test function.

In an example shown in FIG. 2, a first latch (i.e., the latch for the VBLEQTrim function), upon being specified by a first predetermined number of bits (two bits A01 and A00) that are part of a plurality of bits entered through a plurality of terminals (address terminals A04 through A00), stores a second predetermined number of bits (three bits A04 through A02) that are at least part of the remaining bits (A04 through A02) left after excluding the first predetermined number of bits from the plurality of bits. Further, a second latch (i.e., the latch for the VPPTrim function), upon being specified by a third predetermined number of bits (three bits A02 through A00) that are part of the plurality of bits entered through the plurality of terminals (address terminals A04 through A00), stores a fourth predetermined number of bits (two bits A04 through A03) that are at least part of the remaining bits (A04 through A03) left after excluding the third predetermined number of bits from the plurality of bits. Here, the first predetermined number (i.e., 2) is different from the third predetermined number (i.e., 3), and the second predetermined number (i.e., 3) is different from the fourth predetermined number (i.e., 2). The second predetermined number of bits (i.e., A04 through A02) stored in the first latch (i.e., the latch for the VBLEQTrim function) specifies an option for the VBLEQTrim function. Further, the fourth predetermined number of bits (i.e., A04 through A03) stored in the second latch (i.e., the latch for the VPPTrim function) specifies an option for the VPPTrim function. The configuration of such registers will later be described in detail.

FIG. 3 is a drawing showing an example of the configuration of a semiconductor memory device. A semiconductor memory device 10 shown in FIG. 3 includes a plurality of address terminals 11, a plurality of other signal terminals 12, a plurality of buffers 13 corresponding to respective terminals, a pre-address control unit 14, a command control unit 15, a timing control unit 16, a power generating unit 17, a test register 18, a mode register 19, and banks 20 through 23. In FIG. 3, signal line connections between circuit components are illustrated only for main connections for the sake of discernibility of illustrated parts.

The banks 20 through 23 all have the same configuration. Each of the banks 20 through 23 includes, as shown in the bank 20 serving to be representative, a memory cell array 24, a row control unit 25, a column control unit 26, a data bus switch 27, and an address control unit 28.

The plurality of address terminals 11 receive 12-bit address signals A[11:0]. Here, X[y, z] represents the z-th bit to the y-th bit of a signal X. The signal terminals 12 serve to receive bank address BA[1:0], chip select CS, row address strobe RAS, column address strobe CAS, write enable WE, a clock signal CLK, clock enable CKE, byte mask signals DQM[1:0], data signals DQ[15:0], a power supply voltage VDD, a ground voltage VSS, a stepped-up voltage VPP, and a back-bias voltage VBB. The signals or voltages applied to these terminals are supplied to corresponding circuit parts via the buffers 13. The power supply voltage VDD, ground voltage VSS, stepped-up voltage VPP, and back-bias voltage VBB are directly supplied to the power generating unit 17 without the intervening buffers 13.

The command control unit 15 receive control signals comprised of the chip select CS, the row address strobe RAS, the column address strobe CAS, and the write enable WE. The command control unit 15 decodes these control signals to generate various control signals based on the decoded results. These control signals are supplied to relevant circuit parts such as the timing control unit 16, the test register 18, the mode register 19, and so on. For example, the command control unit 15 supplies, to the test register 18, a signal tespz indicating the loading of test function and option settings to the registers. Further, the command control unit 15 supplies a signal mrspz indicating the setting of an operation mode such as a test mode to the mode register 19.

The timing control unit 16 generates various timing signals corresponding to operations (e.g., data read operation, data write operation, and the like) specified by the control signals based on the control signals from the command control unit 15, the clock signal CLK, and the clock enable signal CKE. The generated timing signals are supplied to the banks 20 through 23, for example. Each circuit part operates in accordance with the timings specified by these timing signals.

The pre-address control unit 14 receives the bank address BA[1:0] and address signals A[11:0]. The pre-address control unit 14 specifies one of the banks 20 through 23 according to the results obtained by decoding the bank address BA[1:0]. Further, the pre-address control unit 14 supplies address signals grax[11:0] having the same logic levels as the address signals A[11:0] to the test register 18, the mode register 19, and the banks 20 through 23.

The power generating unit 17 generates the stepped-up potential VPP by using a stepping-up circuit based on the power supply potential VDD and the ground potential VSS, and also generates the back-bias potential VBB by using a negative-voltage generating circuit. The stepped-up potential VPP is used as a word-line activation potential, and the back-bias potential VBB is used as a back bias in the circuit portion constituting the memory cell array. VPP and VBB that are externally supplied in FIG. 3 are voltages applied from an external source when the VPP external supply function and the VBB external supply function are specified, respectively. The power generating unit 17 is further configured to control an equalize level VBLEQ, a memory-cell plate potential VPL, and the like in test operations.

In the memory cell array 24, a plurality of memory cells are arranged in a matrix form extending in a row direction and a column direction to constitute a cell array. Each memory cell stores data. The memory cell array 24 includes a plurality of word lines corresponding to a plurality of row addresses, and a plurality of memory cells are coupled to each word line. A plurality of bits lines are arranged in a direction in which column addresses are arranged, and sense amplifiers are coupled to the respective bit lines.

The row control unit 25 decodes a row address supplied from the pre-address control unit 14 via the address control unit 28, and activates a word line specified by the row address. The column control unit 26 decodes a column address supplied from the pre-address control unit 14 via the address control unit 28, and activates a column selecting line specified by the column address.

Data stored in memory cells connected to an activated word line are read to the bit lines and amplified by the sense amplifiers. In the case of read operation, the data amplified by the sense amplifiers is subjected to selection by an activated column selecting line, and the selected data is output to outside the semiconductor memory device from the DQ signal terminals 12 via the data bus switch 27. In the case of write operation, write data is supplied from an external source outside the semiconductor memory device via the DQ signal terminals 12 and the data bus switch 27, and is written to sense amplifiers at the column address selected by an activated column selecting line. This write data and the data that were read from memory cells and ought to be restored are written to the memory cells connected to an activated word line.

Figure 4:
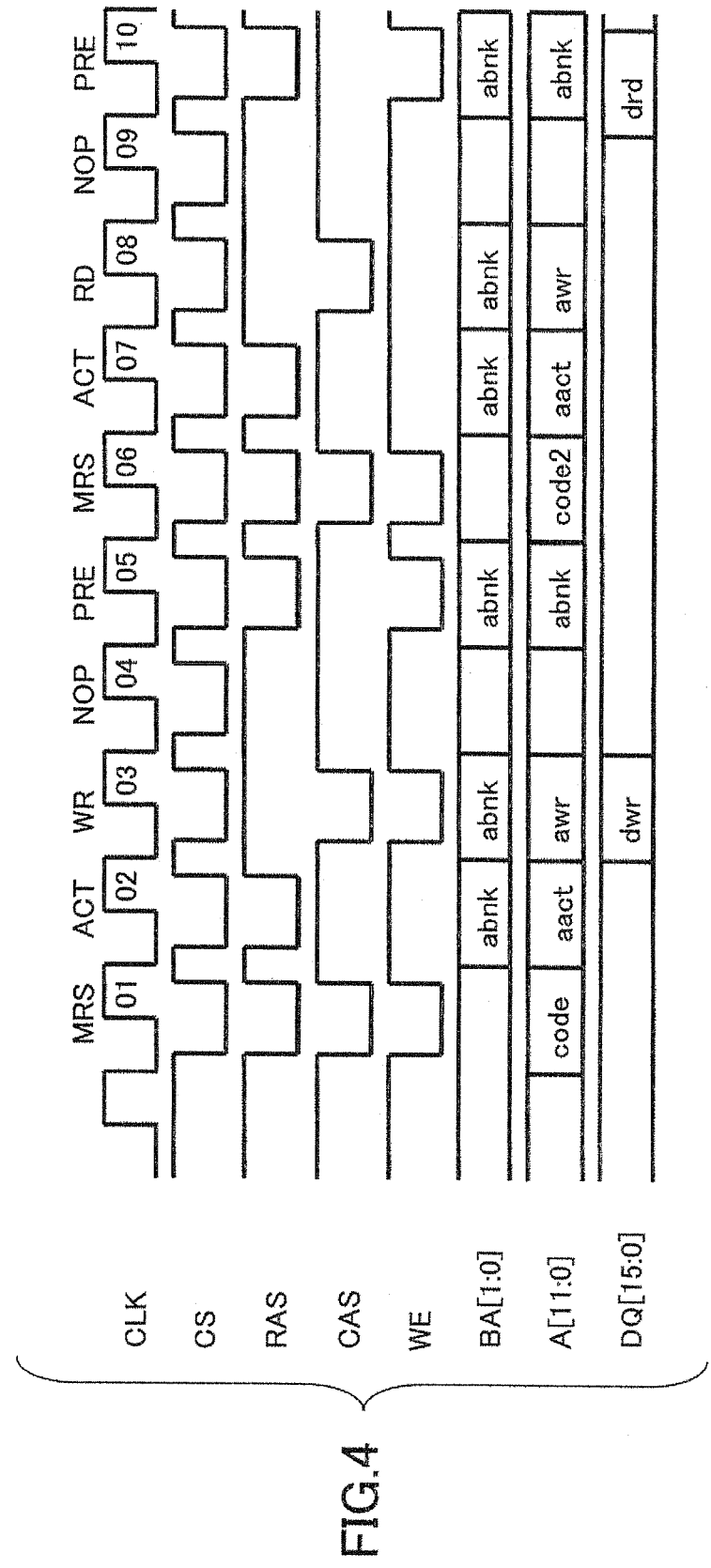
FIG. 4 is a drawing showing a signal input/output sequence for causing the semiconductor memory device to perform a test operation.

FIG. 4 is a drawing showing a signal input/output sequence for causing the semiconductor memory device 10 to perform a test operation. At the first clock cycle (01), CS, RAS, CAS, and WE are all set to LOW to enter a register setting command MRS. At the same time, the address signals A[11:0] supplied to the address terminals 11 are used to specify a code, thereby specifying a test function and an option. CS, RAS, CAS, and WE are then set to L, L, H, and H to enter an activation command ACT. At the same time, a bank address abnk and a row address aact are supplied. Thereafter, CS, RAS, CAS, and WE are set to L, H, L, and L to enter a write command WR. At the same time, a bank address abnk, a column address awr, and a write data dwr are supplied. Through the operation described above, test-purpose data is written to the specified address. Finally, CS, RAS, CAS, and WE are set to L, L, H, and L to enter a precharge command PRE. Through the operations described above, the writing of test-purpose data to the specified address is completed.

At the sixth clock cycle (06), CS, RAS, CAS, and WE are all set to LOW to enter a register setting command MRS. At the same time, the address signals A[11:0] supplied to the address terminals 11 are used to specify another code (code2) different from the previous code, thereby specifying a test function and an option. CS, RAS, CAS, and WE are then set to L, L, H, and H to enter an activation command ACT. At the same time, a bank address abnk and a row address aact are supplied. CS, RAS, CAS, and WE are then set to L, H, L, and H to enter a read command RD. At the same time, a bank address abnk and a column address awr are supplied. Finally, CS, RAS, CAS, and WE are set to L, L, H, and L to enter a precharge command PRE. Read data drd is read after the passage of a predetermined latency following the read command. Through the operations described above, the reading of the test-purpose data from the specified address is completed.

In the data writing and data reading operations described above, desired operating conditions are set by specifying test functions and options. For example, a word-line activation potential for use in the write and read operations is set to a specified potential to check whether data writing and data reading are correctly performed. Alternatively, a sense amplifier activation timing in the write and read operations is adjusted, for example, to check whether data writing and data reading are correctly performed.

In the operations described above, the supply of the register setting command MRS entered by setting CS, RAS, CAS, and WE to LOW causes the command control unit 15 to assert a signal tespz shown in FIG. 3. In response to the assertion of the signal tespz, the test register 18 shown in FIG. 3 sets internal registers in accordance with the address signals grax [11:0] having the same logic levels as the address signals A[11:0]. Thereafter, each circuit part operates in accordance with signals tesz[0:128] and tsaz output in response to the internal register settings of the test register 18, so that the voltage generated by the power generating unit 17 may be adjusted, and/or the sense amplifier activation timing specified by the timing control unit 16 may be adjusted. Voltages directly applied from an external source may as well be used.

In the semiconductor memory device 10 shown in FIG. 3, the address signals A[11:0] applied to the address terminals 11 are used to specify test functions and options. In the following example, allocation of codes to the address signals A[11:0] will be described with reference to a case in which there are 2 functions requiring a 7-bit code for specifying one of the different options provided for each function, 8 functions requiring a 5-bit code for specifying one of the different options provided for each function, 16 functions requiring a 3-bit code for specifying one of the different options provided for each function, 16 functions requiring a 2-bit code for specifying one of the different options provided for each function, and 32 functions requiring a 0-bit code for specifying one of the different options provided for each function. In this case, a total of 74 (=2+8+16+16+32) functions are provided.

It should be noted that an address signal A08 is already assigned to be set to "1" when using a mode register set MRS for setting a test operation mode in the mode register 19. Namely, the address signal A08 is reserved for the mode register set MRS, and cannot be used for the purpose of allocating codes. Further, an address signal A07 is already assigned to be set to "1" when entering a test operation mode and to be set to "0" when exiting from a test operation mode. Namely, the address signal A07 is reserved for specifying entering/exiting into/from a test operation, and cannot be used for the purpose of allocating codes.

FIG. 5A is a drawing showing an example of allocation of a main code and sub-code with respect to a function requiring a 7-bit code for discriminating different options provided in each function. Since 7 bits are necessary to discriminate different options provided in each function, a sub-code requires 7 bits. In this case, 7 bits A06 through A00 are allocated for use as a sub-code ("Sub"). Further, three bits A11 through A09 are allocated for use as a main code. In FIG. 5A, the main code is denoted as a group code ("Group"). Here, the group code refers to a portion of a main code that is used to discriminate groups into which functions having sub-codes comprised of the same number of bits are grouped. In this example, there are a total of 5 groups, including a group having 7-bit sub-codes, a group having 5-bit sub-codes, a group having 3-bit sub-codes, a group having 2-bit sub-codes, and a group having 0-bit sub-codes. Three bits are required to discriminate these 5 groups, so that 3 bits are allocated for use a group code.

The group having 7-bit sub-codes is specified by the group code A11 through A09 being "11x" (x: don't care). There are 2 different functions in the group having 7-bit sub-codes. In order to discriminate these two functions, A09 that is part of the group code may be used.

FIG. 5B is a drawing showing an example of allocation of a main code and sub-code with respect to a function requiring a 5-bit code for discriminating different options provided in each function. Since 5 bits are necessary to discriminate different options provided in each function, a sub-code requires 5 bits. In this case, 5 bits A06 through A02 are allocated for use as a sub-code ("Sub"). Further, three bits A11 through A09 and two bits A01 and A00, which are 5 bits in total, are allocated for use as a main code. Among these 5 bits, three bits A11 through A09 are allocated for use as a group code ("Group").

The group having 5-bit sub-codes is specified by the group code A11 through A09 being "10x" (x: don't care). There are 8 different functions in the group having 5-bit sub-codes. In order to discriminate these 8 functions, A09 that is part of the group code and the remaining bits A01 and A00 of the main code, which are 3 bits in total, may be used.

FIG. 5C is a drawing showing an example of allocation of a main code and sub-code with respect to a function requiring a 3-bit code for discriminating different options provided in each function. Since 3 bits are necessary to discriminate different options provided in each function, a sub-code requires 3 bits. In this case, 3 bits A06 through A04 are allocated for use as a sub-code ("Sub"). Further, three bits A11 through A09 and four bits A03 through A00, which are 7 bits in total, are allocated for use as a main code. Among these 7 bits, three bits A11 through A09 are allocated for use as a group code ("Group").

The group having 3-bit sub-codes is specified by the group code A11 through A09 being "100". There are 16 different functions in the group having 3-bit sub-codes. In order to discriminate these 16 functions, the remaining bits A03 through A00 of the main code left after excluding the group code, which are 4 bits in total, are used.

FIG. 5D is a drawing showing an example of allocation of a main code and sub-code with respect to a function requiring a 2-bit code for discriminating different options provided in each function. Since 2 bits are necessary to discriminate different options provided in each function, a sub-code requires 2 bits. In this case, 2 bits A06 and A05 are allocated for use as a sub-code ("Sub"). Further, three bits A11 through A09 and four bits A03 through A00, which are 7 bits in total, are allocated for use as a main code. Among these 7 bits, three bits A11 through A09 are allocated for use as a group code ("Group").

The group having 2-bit sub-codes is specified by the group code A11 through A09 being "011". There are 16 different functions in the group having 2-bit sub-codes. In order to discriminate these 16 functions, the remaining bits A03 through A00 of the main code left after excluding the group code, which are 4 bits in total, are used. In this case, bit A04 is not necessary, and is not used.

FIG. 5E is a drawing showing an example of allocation of a main code and sub-code with respect to a function requiring a 0-bit code for discriminating different options provided in each function. Since 0 bits are necessary to discriminate different options provided in each function, a sub-code requires 0 bits. In this case, no bit is allocated for a sub-code. Further, three bits A11 through A09 and four bits A03 through A00, which are 7 bits in total, are allocated for use as a main code. Among these 7 bits, three bits A11 through A09 are allocated for use as a group code ("Group").

The group having 0-bit sub-codes is specified by the group code A11 through A09 being "00x" (x: don't care). There are 32 different functions in the group having 0-bit sub-codes. In order to discriminate these 32 functions, A09 that is part of the group code and the remaining bits A03 through A00 of the main code, which are 5 bits in total, are used. In this case, bits A06 through A04 are not necessary, and are not used.

Figure 6:
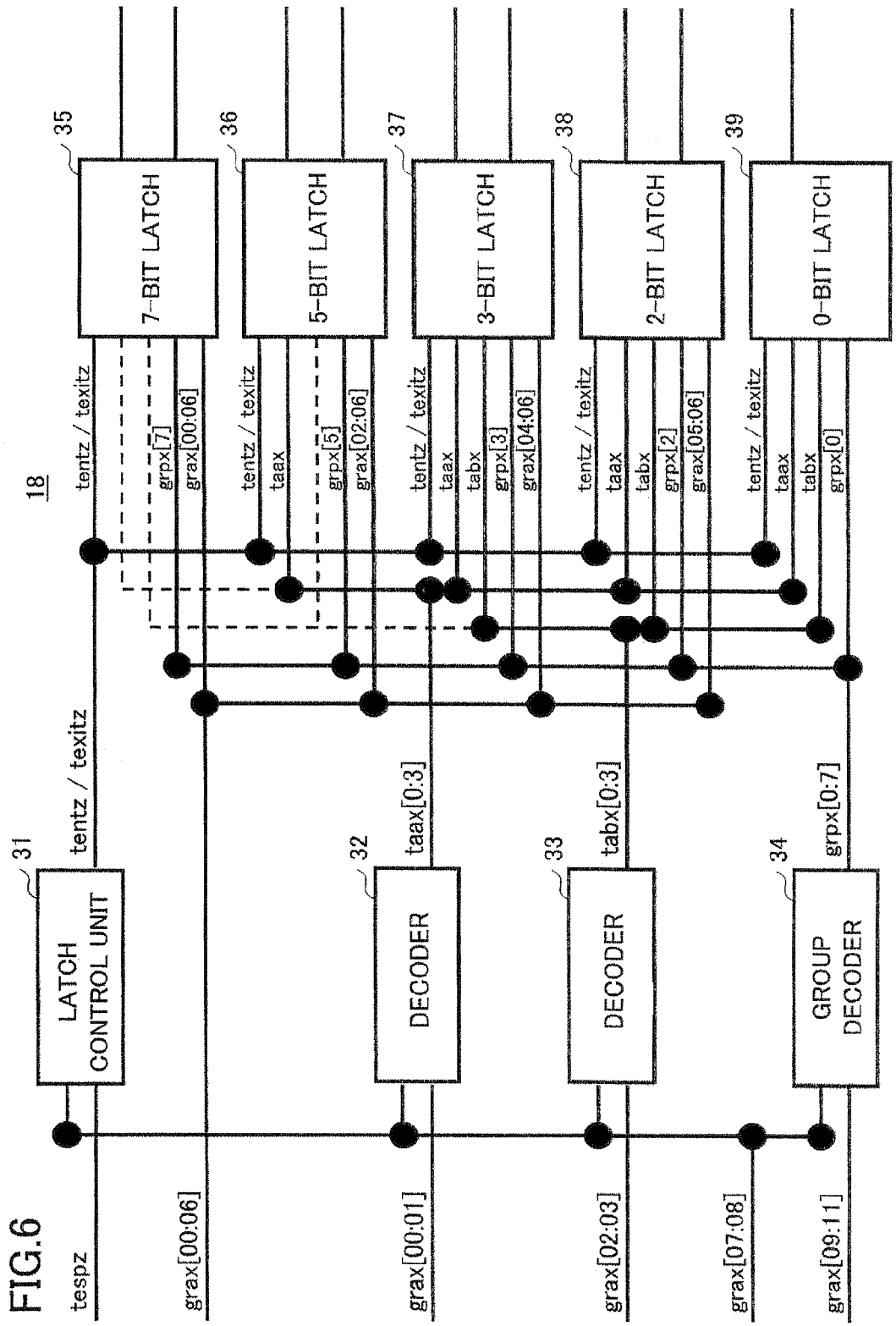
FIG. 6 is a drawing showing an example of the configuration of a test register shown in FIG. 3 in the case where the code allocation scheme shown in FIGS. 5A through 5E are used.

FIG. 6 is a drawing showing an example of the configuration of the test register 18 shown in FIG. 3 in the case where the code allocation scheme shown in FIGS. 5A through 5E are used. In FIG. 6, the test register 18 includes a latch control unit 31, a decoder 32, a decoder 33, a group decoder 34, a 7-bit latch 35, a 5-bit latch 36, a 3-bit latch 37, a 2-bit latch 38, and a 0-bit latch 39.

The address signals A00 through A11 shown in FIGS. 5A through 5E correspond to the address signals grax[00:11]. It should be noted that a signal with a signal name ending with "z" is positive logic, and a signal with a signal name ending with "x" is negative logic. The address signals grax[00:11] are supplied as negative logic signals. In response to grax[07:08] and the signal tespz, the latch control unit 31 generates a signal tentz requesting the setting of each latch and a signal texitz requesting the resetting of each latch. In response to the assertion of grax[07] (i.e., 1 bit of the signal grax specified by "07") to "0", the latch control unit 31 sets the signal tentz to HIGH. In response to the negation of grax[07] (i.e., 1 bit of the signal grax specified by "07") to "1", the latch control unit 31 sets the signal texitz to HIGH.

The decoder 32 decodes grax[00:01] that is part of the main code to produce a decode signal taax[0:3]. The decoder 33 decodes grax[02:03] that is part of the main code to produce a decode signal tabx[0:3]. The reason why the decoder 32 and the decoder 33 are provided as separate circuits is that while A00 through A03 are main codes in FIGS. 5C through 5E, A00 and A01 are a main code and A02 and A03 are a sub-code in the case of FIG. 5B. The decoder 32 is responsible for the decoding of A00 and A01 while the decoder 33 is responsible for the decoding of A02 and A03. The group decoder 34 decodes grax[09:11] that is a group code to produce a decode signal grpx[0:7]. The decode signals produced by these decoders uniquely specify one of the provided latches.

For the sake of simplicity of illustration, only one 7-bit latch 35 that receives decode signal grpx[7] is illustrated in FIG. 6. In reality, however, two 7-bit latches 35 are provided in one-to-one correspondence to two functions, one of which receives grpx[7] and the other receives grpx[6]. grpx[7] is asserted in the case of the group code A11 through A09 being "111", and grpx[6] is asserted in the case of the group code A11 through A09 being "110". In this manner, the use of A09 that is part of the group code makes it possible to discriminate 2 different functions.

When one 7-bit latch 35 is uniquely specified by the decode signals, this specified 7-bit latch 35 stores (latches) the value of grax[00:06] that is a sub-code. Upon the setting of the value, output tes7#z of this 7-bit latch 35 is asserted to HIGH, and, also, output tsa7#z[0:6] that is logically inverse to grax[00:06] is output. The assertion of tes7#z indicates that the outputs of the 7-bit latch 35 are valid, so that the output tsa7#z[00:06] can specify what the option setting is. Here, "#" appearing in a signal name is a symbol for discriminating two 7-bit latches 35 provided for the two respective functions, and assumes "0" or "1" depending on which function is referred to.

The 7-bit latch 35 receives the decode signal only from the group decoder 34, and does not receive any decode signals from the decoder 32 or the decoder 33. In order to allow visualization of signal paths that are not conveying signals, the position of signal lines that are not in existence in reality are shown by dotted lines. The reason why the signal lines shown by dotted lines are not in existence is that the functions requiring 7-bit sub-codes can be specified by using only a group code as shown in FIG. 5A. The absence of the signal paths shown by dotted lines significantly reduces the number of signal lines in the test register 18 compared with conventional configurations.

By the same token, only one 5-bit latch 36 that receives decode signal grpx[5] is illustrated in FIG. 6. In reality, however, eight 5-bit latches 36 are provided in one-to-one correspondence to eight functions, four of which receive grpx[5] and the remaining four receive grpx[4]. grpx[5] is asserted in the case of the group code A11 through A09 being "101", and grpx[4] is asserted in the case of the group code A11 through A09 being "100". The assertion of one of the two signals causes selection of either the first four 5-bit latches 36 or the second four 5-bit latches 36. In order to uniquely specify one of the four selected 5-bit latches 36, each bit taax of decode output taax[0:3] of the decoder 32 is supplied to a corresponding one of the 5-bit latches 36. This makes it possible to specify one function.

When one 5-bit latch 36 is uniquely specified by the decode signals, this specified 5-bit latch 36 stores (latches) the value of grax[02:06] that is a sub-code. Upon the setting of the value, output tes5#z of this 5-bit latch 36 is asserted to HIGH, and, also, output tsa5#z/2:6] that is logically inverse to grax[02:06] is output. The assertion of tes5#z indicates that the outputs of the 5-bit latch 36 are valid, so that the output tsa5#z/2:6] can specify what the option setting is. Here, "#" appearing in a signal name is a symbol for discriminating eight 5-bit latches 36 provided for the eight respective functions, and assumes one of "0" through "7" depending on which one of the eight functions is referred to.

The 5-bit latch 36 receives the decode signals only from the group decoder 34 and the decoder 32, and does not receive any decode signals from the decoder 33. In order to allow visualization of signal paths that are not conveying signals, the position of signal lines that are not in existence in reality are shown by dotted lines. The reason why the signal lines shown by dotted lines are not in existence is that the functions requiring 5-bit sub-codes can be specified by using only a group code and AO to A1 as shown in FIG. 5B. The absence of the signal paths shown by dotted lines significantly reduces the number of signal lines in the test register 18 compared with conventional configurations.

As for 3-bit latches 37, sixteen 3-bit latches 37 are provided in one-to-one correspondence to the 16 functions. Each 3-bit latch 37 receives decode signal grpx[3]. The assertion of decode signal grpx[3] causes the sixteen 3-bit latches 37 to be selected among all the latches shown in FIG. 6. In order to uniquely specify one of the sixteen selected 3-bit latches 37, each bit taax of decode output taax[0:3] of the decoder 32 and each bit tabx of decode output tabx[0:3] of the decoder 33 are used. The specified one of the 3-bit latches 37 stores (latches) the value of grax[04:06] that is a sub-code. The roles of the outputs of the 3-bit latch 37 are the same as those of the outputs of the 7-bit latch 35 and the 5-bit latch 36 as previously described.

As for 2-bit latches 38, sixteen 2-bit latches 38 are provided in one-to-one correspondence to the 16 functions. Each 2-bit latch 38 receives decode signal grpx[2]. The assertion of decode signal grpx[2] causes the sixteen 2-bit latches 38 to be selected among all the latches shown in FIG. 6. In order to uniquely specify one of the sixteen selected 2-bit latches 38, each bit taax of decode output taax[0:3] of the decoder 32 and each bit tabx of decode output tabx[0:3] of the decoder 33 are used. The specified one of the 2-bit latches 38 stores (latches) the value of grax[05:06] that is a sub-code. The roles of the outputs of the 2-bit latch 38 are the same as those of the outputs of the 7-bit latch 35 and the 5-bit latch 36 as previously described.

As for 0-bit latches 39, thirty-two 0-bit latches 39 are provided in one-to-one correspondence to the 32 functions. Sixteen of them receive grpx[0], and the remaining sixteen receive grpx[1]. grpx[1] is asserted in the case of the group code A11 through A09 being "001", and grpx[0] is asserted in the case of the group code A11 through A09 being "000". The assertion of one of the two signals causes selection of either the first sixteen 0-bit latches 39 or the second sixteen 0-bit latches 39. In order to uniquely specify one of the sixteen selected 0-bit latches 39, each bit taax of decode output taax[0:3] of the decoder 32 and each bit tabx of decode output tabx[0:3] of the decoder 33 are used. The specified one of the 0-bit latches 39 does not latch the sub-code, but asserts its output tes0#z to indicate that the latch has been specified. Here, "#" appearing in a signal name is a symbol for discriminating thirty-two 0-bit latches 39 provided for the 32 respective functions, and assumes one of "0" through "31" depending on which one of the 32 functions is referred to.

In the manner as described above, the decode outputs of the decoder 32, the decoder 33, and the group decoder 34 are used to uniquely specify one latch (i.e., one function) with respect to the 3-bit latches 37, the 2-bit latches 38, and the 0-bit latches 39.

Figure 7:
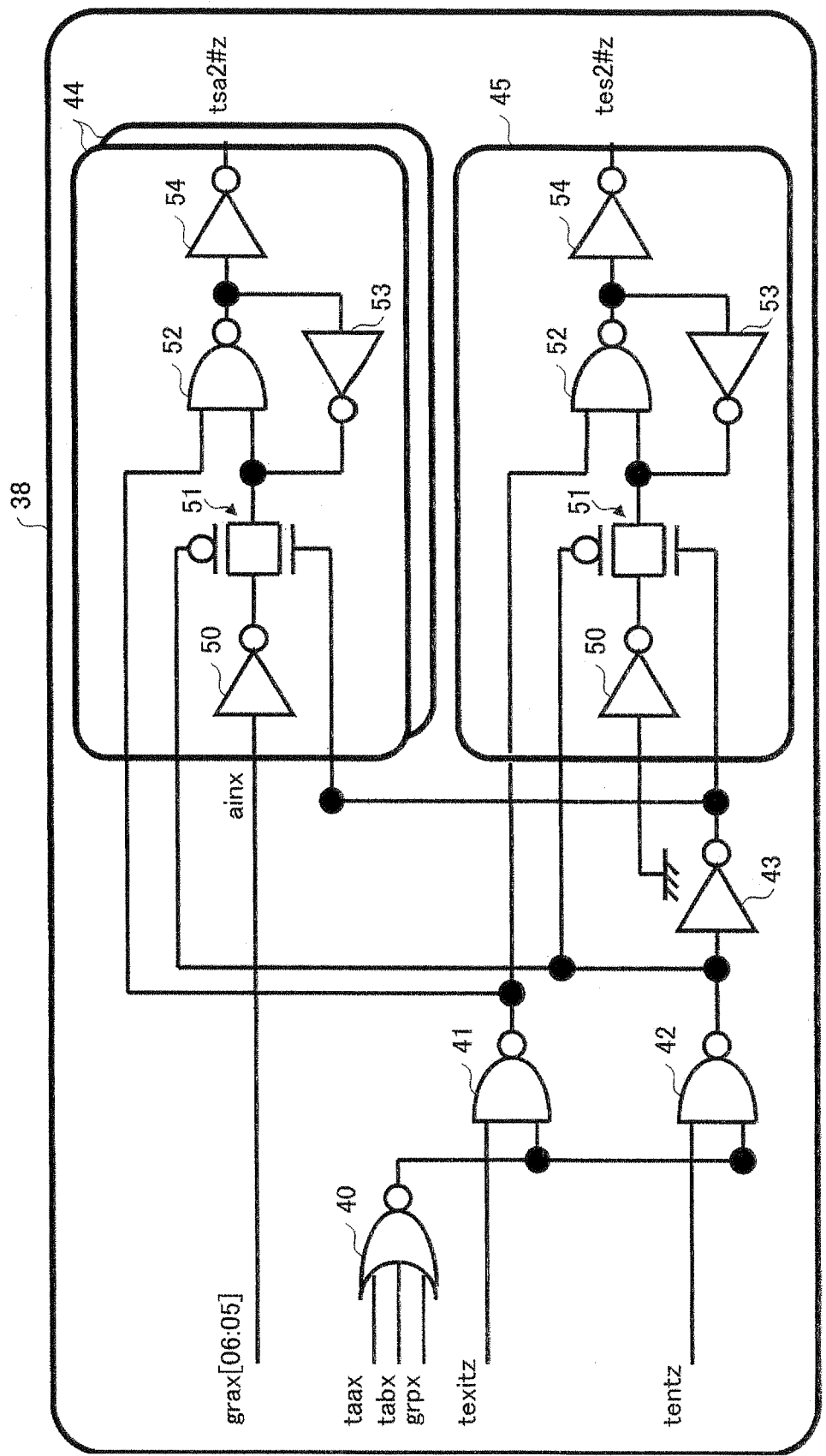
FIG. 7 is a drawing showing an example of the configuration of a 2-bit latch shown in FIG. 6.

FIG. 7 is a drawing showing an example of the configuration of the 2-bit latch 38 shown in FIG. 6. The 2-bit latch 38 shown in FIG. 7 includes a NOR gate 40, a NAND gate 41, a NAND gate 42, an inverter 43, two latch circuits 44, and a latch circuit 45. The two latch circuits 44 and the latch circuit 45 all have the same configuration, and each include an inverter 50, a transfer gate 51 comprised of a PMOS transistor and an NMOS transistor, a NAND gate 52, an inverter 53, and an inverter 54.

One bit taax of the decode signals taax[0:3] output from the decoder 32, one bit tabx of the decode signals tabx[0:3] output from the decoder 33, and one bit grpx (=grpx[2]) of the decode signals grpx[0:7] output from the group decoder 34 are supplied to the NOR gate 40. When all these three inputs are asserted to "0", the 2-bit latch 38 shown in FIG. 7 is uniquely specified, so that the output of the NOR gate 40 becomes HIGH. At the time of register setting, texitz is set to LOW, and tentz is set to HIGH. Accordingly, the output of the NAND gate 42 is set to LOW, so that the transfer gate 51 becomes conductive in each of the latch circuits 44 and 45. As a result, the two latch circuits 44 store two bits grax [06:05], so that the output signals tsa2#z are logically inverse to grax [06:05]. Further, the latch circuit 45 stores the ground potential LOW, so that the output signal tes2#z becomes HIGH that is logically inverse to LOW.

At the time of register resetting, texitz is set to HIGH, and tentz is set to LOW. Accordingly, the output of the NAND gate 41 is set to LOW, so that the output of the NAND gate 52 is set to HIGH in each of the latch circuits 44 and 45. This causes all the outputs of the latch circuits 44 and 45 to be set to LOW.

Only the configuration of the 2-bit latch 38 is shown in FIG. 7. The 7-bit latch 35, 5-bit latch 36, 3-bit latch 37, and 0-bit latch 39 can be configured similarly to the manner in which the 2-bit latch 38 is configured. In the case of the 0-bit latch 39, however, the latch circuits 44 are not necessary, and only the latch circuit 45 is provided.

Figure 8:
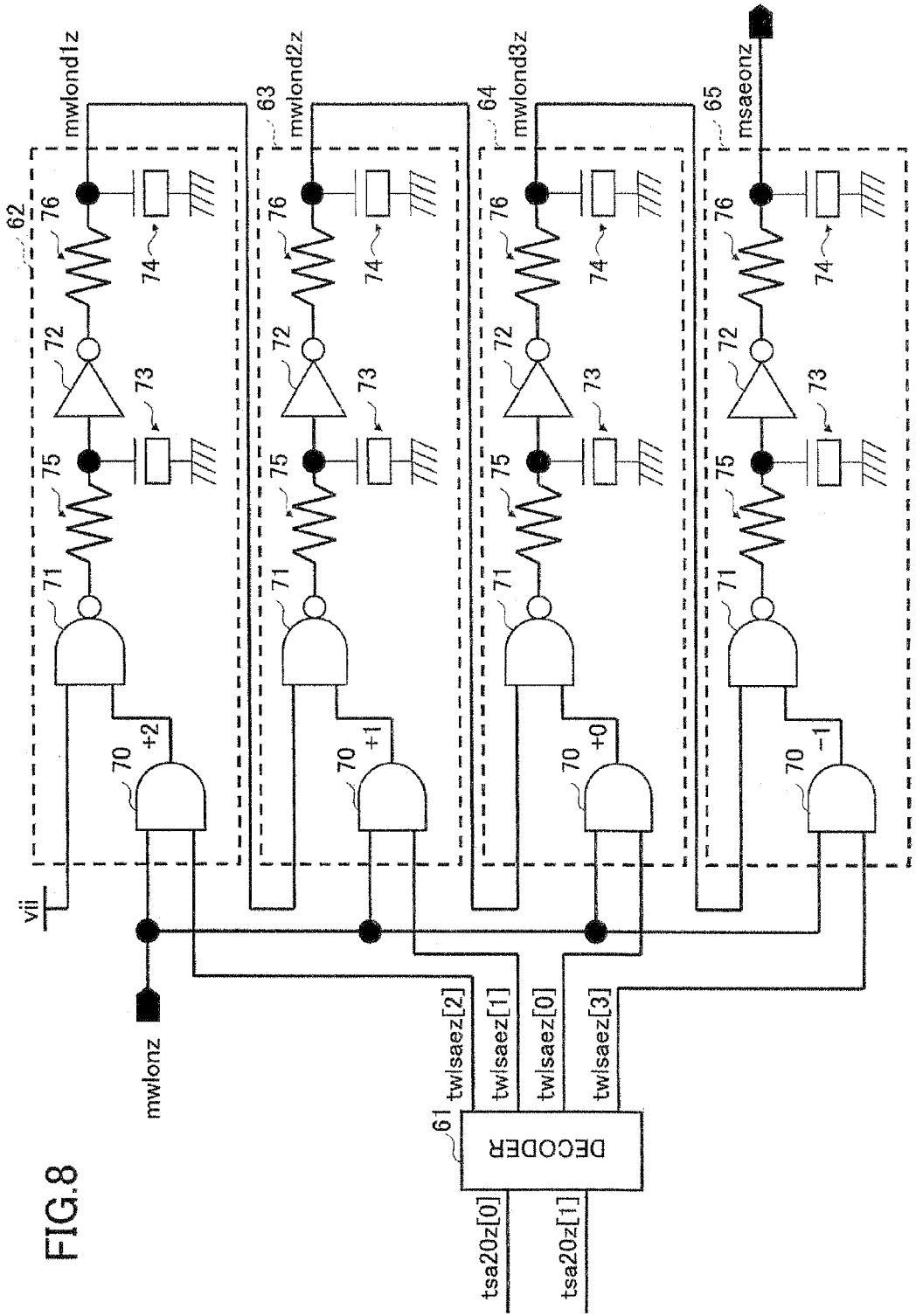
FIG. 8 is a drawing showing an example of a test circuit that operates according to test function settings and option settings.

FIG. 8 is a drawing showing an example of a test circuit that operates according to test function settings and option settings. The test circuit shown in FIG. 8 serves to provide a test function for adjusting sense amplifier activation timing, and may be provided in the timing control unit 16 of the semiconductor memory device 10 shown in FIG. 3.

The test circuit shown in FIG. 8 includes a decoder 61 and delay circuits 62 through 65. The delay circuits 62 through 65 all have the same configuration, and each include an AND gate 70, a NAND gate 71, an inverter 72, a capacitor 73, a capacitor 74, a resistor 75, and a register 76. The output signal of the NAND gate 71 propagates with some delay through the signal propagation path comprised of the inverter 72, the capacitor 73, the capacitor 74, the resistor 75, and the register 76.

The decoder 61 receives and decodes tsa20z/0] and tsa20z/1] output from one 2-bit latch 38, and outputs the decode results as signals twlsaez[0] through twlsaez[3]. In response to the specified option, one of twlsaez[0] through twlsaez[3] becomes HIGH. When twlsaez[1] is set to HIGH, a HIGH pulse appears in the output of the AND gate 70 of the delay circuit 63 in response to the HIGH pulse of the signal mwlonz requesting the activation of a word line. In response, a LOW pulse appears in the output of the NAND gate 71. This LOW pulse propagates through the delay circuits 63 through 65, and is output as a sense amplifier activation signal msae-onz after the corresponding delay. The delay time of each one of the delay circuits 62 through 65 is denoted as TD, and the sense amplifier activation signal msaeonz responsive to the assertion of twlsaez[0] to HIGH is a default timing. Then, the assertion of twlsaez[1] corresponds to the "+TD" option. The assertion of twlsaez[2] corresponds to the "+2TD" option. Further, the assertion of twlsaez[3] corresponds to the "−TD" option.

Figure 9:
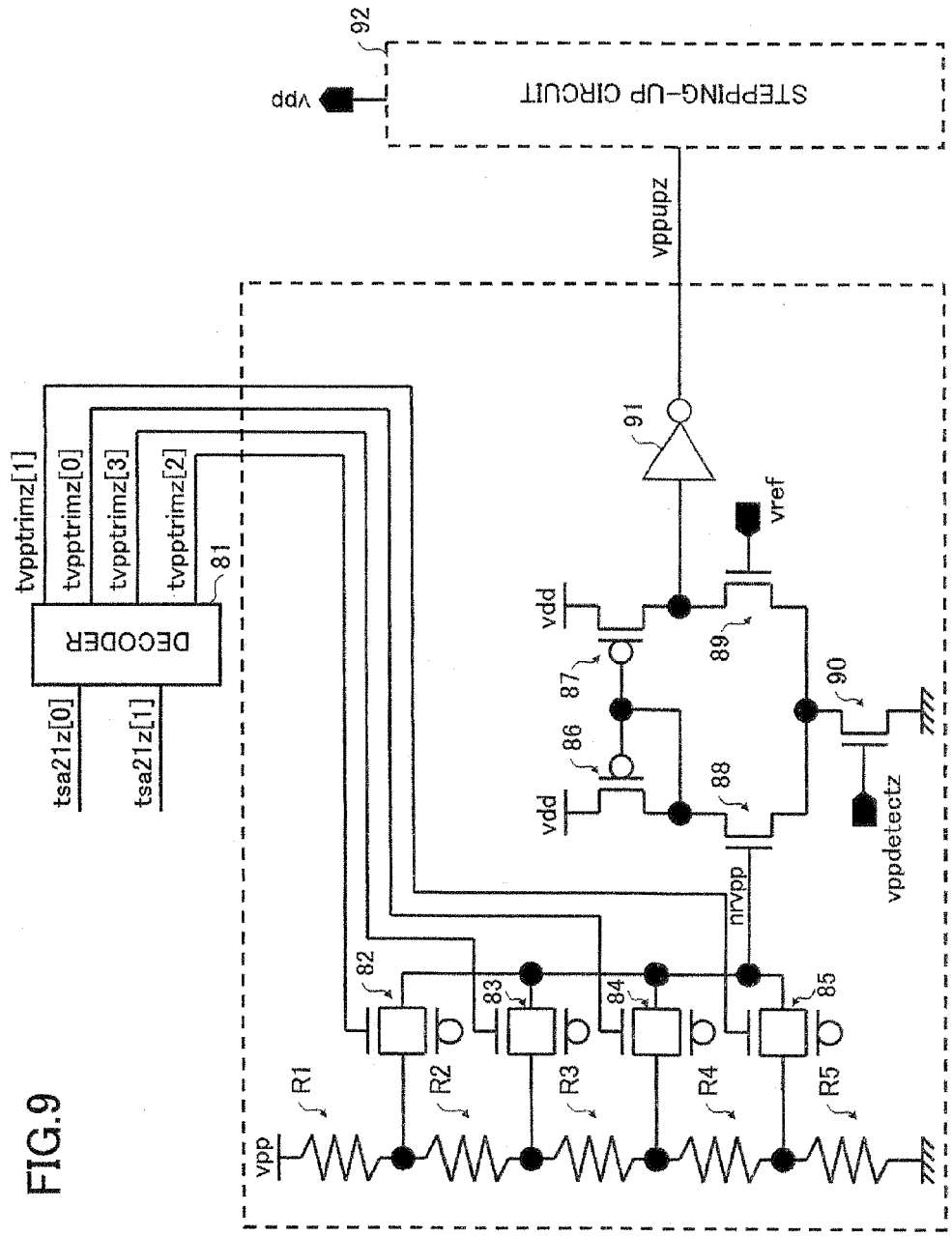
FIG. 9 is a drawing showing another example of a test circuit that operates according to test function settings and option settings.

FIG. 9 is a drawing showing another example of a test circuit that operates according to test function settings and option settings. The test circuit shown in FIG. 9 serves to provide a test function for adjusting the stepped-up potential VPP, and may be provided in the power generating unit 17 of the semiconductor memory device 10 shown in FIG. 3.

The test circuit shown in FIG. 9 includes a decoder 81, transfer gates 82 through 85 each comprised of a PMOS transistor and an NMOS transistor, PMOS transistors 86 and 87, NMOS transistors 88 and 89, an inverter 91, a stepping-up circuit 92, and registers R1 through R5. The PMOS transistors 86 and 87 and the NMOS transistors 88 and 89 constitute a differential amplifier.

The stepping-up circuit 92 operates in response to the assertion of a stepping-up circuit activating signal vppupz to HIGH to generate the stepped-up potential VPP. The generated stepped-up potential VPP is supplied to an end of a potential divider comprised of series connected resistors R1 through R5. Among a plurality of different potentials generated by the potential divider dividing the stepped-up voltage VPP, a potential selected by one of the transfer gates 82 through 85 that is made conductive is supplied as a divided potential nrvpp to the differential amplifier. When the divided potential nrvpp becomes higher than a reference potential vref, the differential amplifier sets an input into the inverter 91 to HIGH. In response, the stepping-up circuit activating signal vppupz is negated to LOW. This causes the operation of the stepping-up circuit 92 to stop, thereby causing the stepped-up potential VPP to drop. When the divided potential nrvpp becomes lower than the reference potential vref, on the other hand, the differential amplifier sets the input into the inverter 91 to LOW. In response, the stepping-up circuit activating signal vppupz is asserted to HIGH. This activates the stepping-up circuit 92, thereby causing the stepped-up potential VPP to rise. Through this feedback control, the stepped-up potential VPP is adjusted equal to a predetermined potential.

The decoder 81 receives and decodes tsa21z/0] and tsa21z/1] output from one 2-bit latch 38, and outputs the decode results as signals tvpptrimz[0] through tvpptrimz[3]. In response to the specified option, one of tvpptrimz[0] through tvpptrimz[3] becomes HIGH. When tvpptrimz[3] is set to HIGH, for example, a voltage obtained by dividing the stepped-up voltage VPP according to (R3+R4+R5)/(R1+R2+R3+R4+R5) is supplied as a divided potential nrvpp to the differential amplifier. In this case, the stepped-up potential VPP is adjusted equal to vref·(R1+R2+R3+R4+R5)/(R3+R4+R5).

Figure 10A:
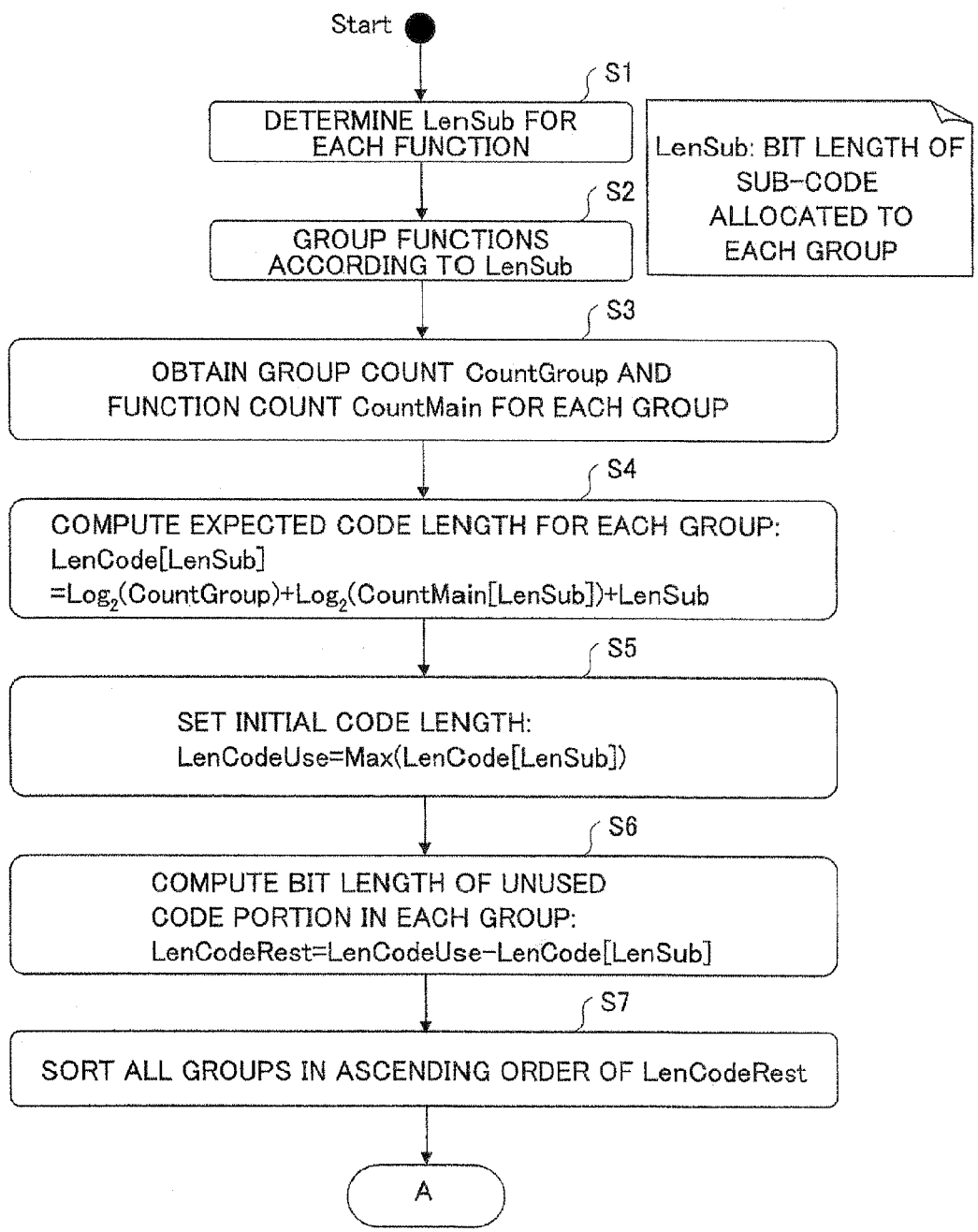
FIG. 10A is a flowchart showing an example of a code allocation method.
Figure 10B:
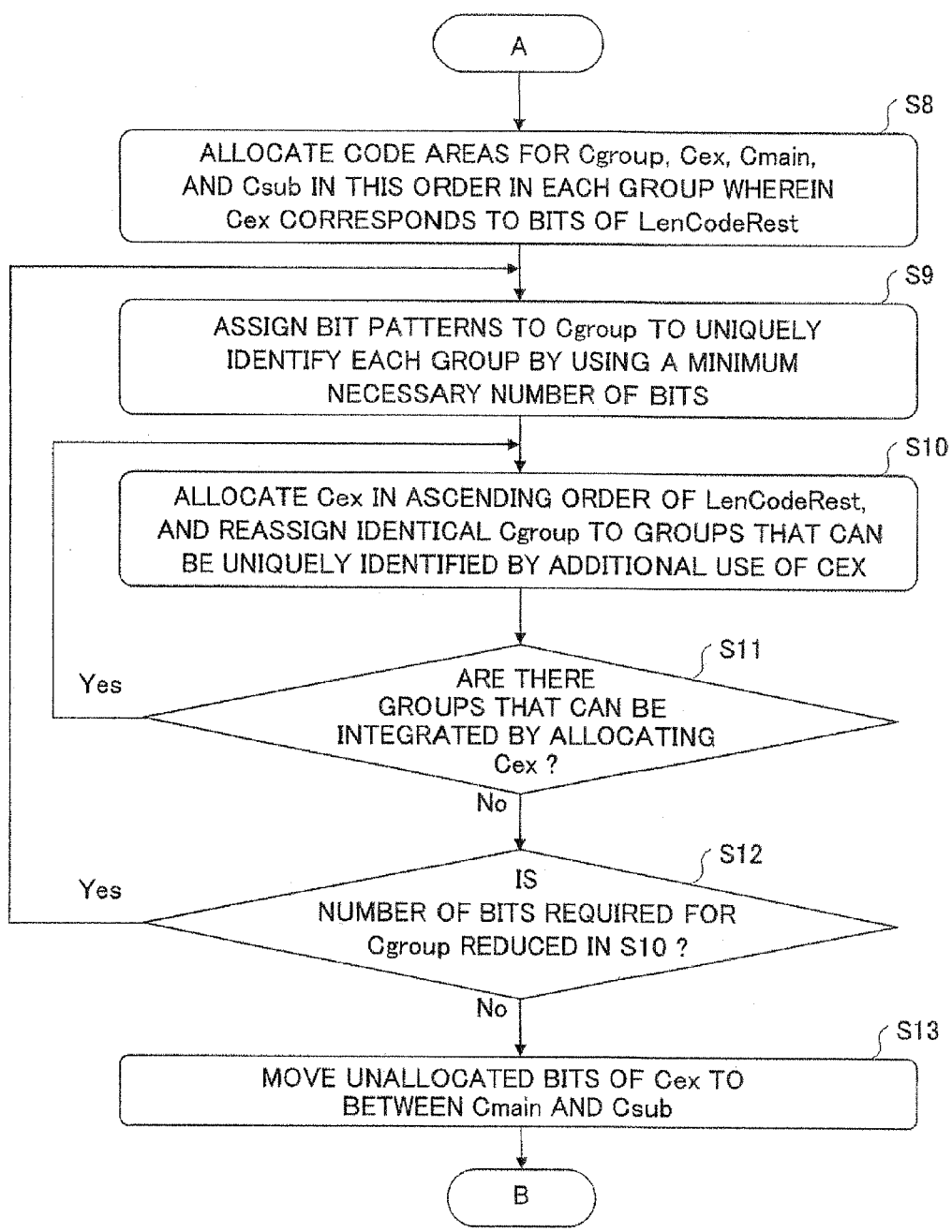
FIG. 10B is a flowchart showing an example of the code allocation method.
Figure 10C:
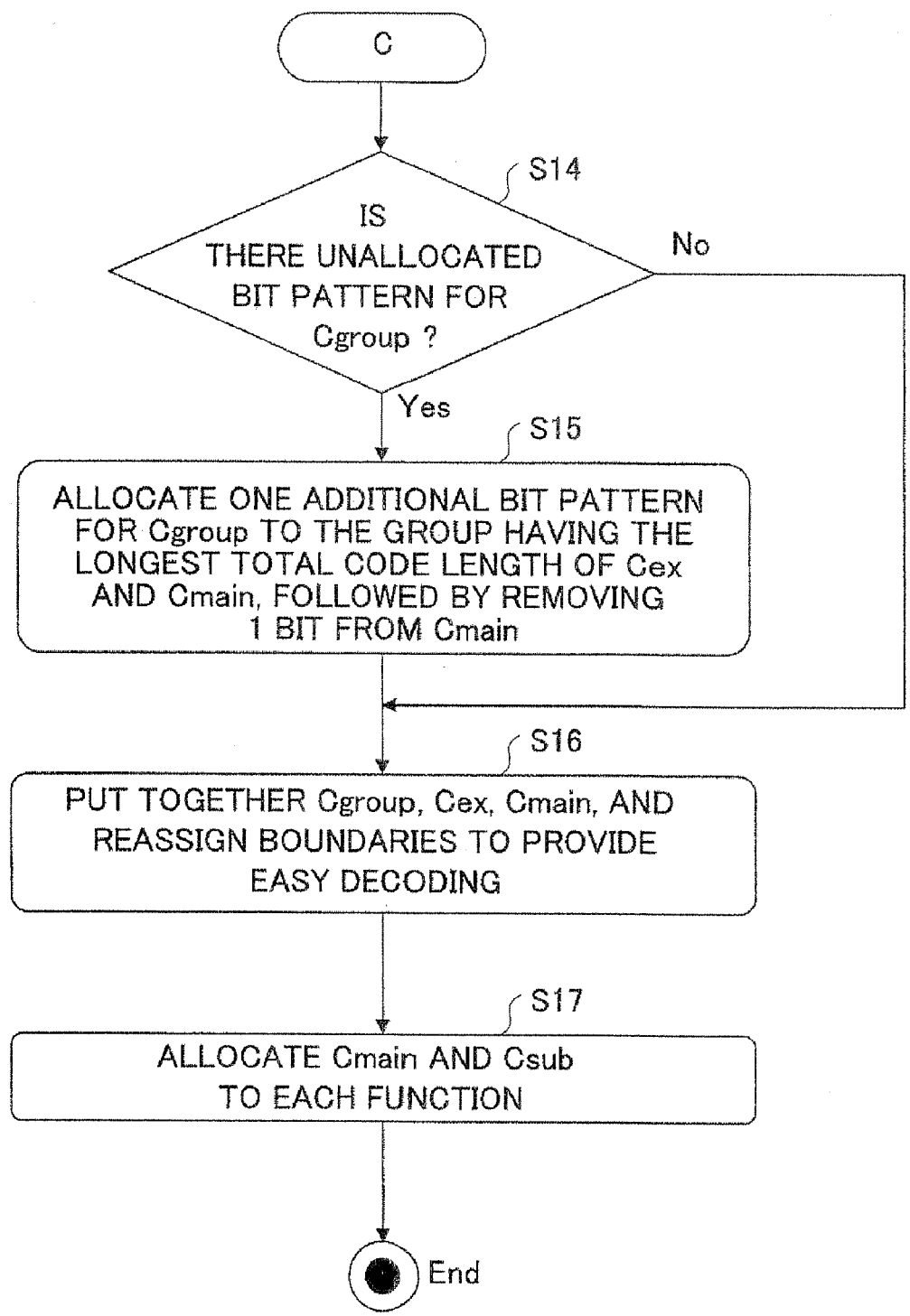
FIG. 10C is a flowchart showing an example of the code allocation method.

FIGS. 10A through 10C are flowcharts showing an example of a code allocation method. In step S1, LenSub that is a bit length of a sub-code assigned to each function is extracted (determined) with respect to each function. In step S2, all the functions are grouped according to LenSub.

In step S3, group count CountGroup and function count CountMain indicative of the number of functions in each group are counted. In step S4, LenCode[LenSub] indicative of the length of an entire code is estimated with respect to each group. The estimated length of an entire code is a sum of the number of bits required to represent the number of the groups, the number of bits required to represent the functions belonging to each group, and the number of bits of the sub-code. Namely, LenCode is expressed as follows.

$$\text{LenCode[LenSub]}=\text{Log}_2(\text{CountGroup})+\text{Log}_2(\text{CountMain[LenSub]})+\text{LenSub}$$

In step S5, an initial value of a code length (LenCodeUse) is determined. Here, the initial value of a code length is the largest of estimated code lengths of entire codes (which differ with respect to each group). Namely, the initial value of a code length is obtained as Max(LenCode[LenSub]).

In step S6, LenCodeRest indicative of the bit length of an unused code portion in each group is obtained. Namely, LenCodeRest is obtained as follows.

$$\text{LenCodeRest}=\text{LenCodeUse}-\text{LenCode[LenSub]}$$

In step S7, all the groups are sorted in the ascending order of LenCodeRest.

FIG. 11 is a table showing the groups and computed values determined by performing the steps shown in FIG. 10A. In the example shown in FIG. 11, there are 5 groups which have sub-codes of 7, 5, 3, 2, and 0 bits, respectively, with the respective numbers of functions being 2, 4, 14, 13, and 32.

In step S8 shown in FIG. 10B that is performed after step S7 shown in FIG. 10A, code areas are allocated for Cgroup, Cex, Cmain, and Csub in this order in each group, where Cex corresponds to the bits of LenCodeRest. Here, Cgroup corresponds to the bit area of a group code, Cmain to the bit area of a main code (i.e., the portion of the main code left after excluding the group code), and Csub to the bit area of a sub-code. Cex is an extension code.

FIG. 12 is a drawing showing the allocation of each code area obtained for each group according to step S8 with respect to the example shown in FIG. 11. The number of bits of Csub is equal to LenSub. The number of bits of Cmain is equal to the number of bits required to represent the number of all the functions in each group. The number of bits of Cgroup is equal to the number of bits required to represent the number of all the groups.

In this manner, LenSub that is the minimum number of bits capable of uniquely identifying all the options for each function is determined (step S1) as the number of bits of a sub-code that uniquely identifies an option for each function, followed by grouping the functions (step S2) such that the functions with the sub-codes having the same number of bits are grouped together, allocating the first bit area Csub (step S8) in the bit sequence C10 through C00 of each group for a sub-code comprised of a number of bits unique to each group, allocating the second bit area Cgroup (step S8) in the bit sequence C10 through C00 for a group code capable of uniquely identifying all the groups, and allocating the third bit area Cmain (step S8) to the bit area allocated to neither the first bit area nor the second bit area in the bit sequence for a main code for identifying a function in each group.

Referring to FIG. 10B again, in step S9, bit patterns for uniquely identifying the groups are assigned as Cgroup. FIG. 13 is a drawing showing the allocation of bit patterns for uniquely identifying all the groups according to step S9.

In step S10, Cex is allocated in the ascending order of LenCodeRest, and, then, the groups that can be uniquely identified by additional use of Cex are put together and reassigned with the same bit pattern for Cgroup. In step S11, a check is made as to whether there are groups that can be integrated by allocating Cex. If the result of the check is affirmative (Yes), the procedure goes back to step S10 to repeat the subsequent steps.

FIG. 14 is a drawing showing the allocation of Cex to groups having small LenCodeRest according to step S10. Cex=0 is allocated to Group[3], and Cex=1 is allocated to Group[5]. Since Group[3] and Group[5] can be discriminated (i.e., uniquely identified) by use of an extension code Cex, Group[3] and Group[5] can be integrated. Accordingly, the same bit pattern for Cgroup is reassigned to Group[3] and Group[5].

FIG. 15 is a drawing showing the same bit pattern for Cgroup that is reassigned to Group[3] and Group[5]. The bit pattern "110" is assigned as Cgroup to Group[3] and Group[5].

FIG. 16 is a drawing showing further allocation of Cex according to step S10. Cex=1x is allocated to Group [2], and Cex=0xx is allocated to Group[0]. Since Group[2] and Group[0] can be discriminated (i.e., uniquely identified) by use of an extension code Cex, Group[2] and Group[0] can be integrated. Accordingly, the same bit pattern "100" for Cgroup is reassigned to Group[2] and Group[0].

Referring to FIG. 10B again, in step S12, the number of bits of Cgroup is reduced and codes are reallocated to each group if the number of bits required for Cgroup is reduced by step S10. FIG. 17 is a drawing showing the reallocation of bit patterns after the reduction of numbers of bits for Cgroup according to step S12. From FIG. 16, it can be understood that there are only 3 groups after the integration of groups. It follows that 2 bits are sufficient as the number of bits to represent Cgroup. In FIG. 17, therefore, the number of bits for Cgroup is reduced by one to reduce the bit length of the entire code by one bit. Bit patterns for Cgroup are then reallocated. By repeating S9 through S12, it is possible to obtain the minimum number of bits required for Cgroup.

In step S13, the bits that are not yet allocated in Cex are moved to between Cmain and Csub. FIG. 18 is a drawing showing the state after moving the unallocated bits of Cex to between Cmain and Csub according to step S13.

In step S14 shown in FIG. 10C, a check is made as to whether any unallocated bit pattern exists for Cgroup. If there is an unallocated bit pattern for Cgroup, one additional bit pattern for Cgroup is allocated in step S15 to the group having the longest total code length of Cex and Cmain, followed by removing 1 bit from Cmain.

FIG. 19 is a drawing showing the state after performing the process of step S15. In FIG. 18, the bit pattern "00" for Cgroup is not yet allocated. Accordingly, the bit pattern "00" for Cgroup is additionally allocated to Group[0] having the longest total code length of Cex and Cmain. Further, the number of bits for Cmain in Group[0] is reduced from 5 to 4.

In step S16, Cgroup, Cex, and Cmain are put together, and boundaries are reassigned to achieve easy decoding. FIG. 20 is a drawing showing the state after performing the process of step S16. In FIG. 20, C09 through C07 are decoded by the group decoder, C06 and C05 by the first decoder, and C04 and C03 by the second decoder.

In step S17, finally, Cmain and Csub are allocated to each function. With this, the procedure for allocating codes comes to an end.

In order to provide an advantage over the allocation of fixed numbers of bits to main codes and sub-codes as in the related-art configuration, the bit length of the third bit area Cmain for Group[7] having the longest sub-code bit length is preferably shorter than the bit length of the third bit area Cmain for another group (e.g., Group[3]). Namely, it is preferable to have a smaller number of functions for a group having a larger number of options. In order to provide a further advantage, at least one or more bit positions (e.g., C06 through C03) in the bit sequence C06 through C00 corresponding to the first bit area Csub for Group[7] having the longest sub-code bit length are preferably allocated to the third bit area Cmain in another group (e.g., Group[3]).

In the following, the advantages of the embodiments described above in comparison with the related-art configuration will be described. FIG. 21 is a drawing showing the allocation of codes when the lengths of main codes and sub-codes are fixed with respect to the test functions and options corresponding to the example shown in FIGS. 5A through 5E. In this example as previously described, there are 2 functions requiring a 7-bit code for specifying one of the different options provided for each function, 8 functions requiring a 5-bit code for specifying one of the different options provided for each function, 16 functions requiring a 3-bit code for specifying one of the different options provided for each function, 16 functions requiring a 2-bit code for specifying one of the different options provided for each function, and 32 functions requiring a 0-bit code for specifying one of the different options provided for each function. Since the maximum number of bits required for the purpose of option identification is 7, 7 bits will be allocated for sub-codes having a fixed length. Further, there are 74 functions in total, so that 7-bit main codes having a fixed length will be necessary for the purpose of uniquely identifying each function. As a result, 7-bit main codes and 7-bit sub-codes are used.

FIG. 21 is a drawing showing an example of allocation of terminals to a 7-bit main code and a 7-bit sub-code. In FIG. 21, address bits A00 through A06 are allocated to the main code. The remaining available address bits are A11 through A09, which are only 3 bits. There is thus a need for 4 additional bits assigned for use as a sub-code. Terminals BA0 and BA1 for bank address signals and extension-purpose terminals Ax0 and Ax1, for example, may be used to provide 7 bits for use as a sub-code. In this case, 14 terminals are necessary, which is a significant increase in the numbers of terminals, compared to the 10 terminals necessary in the previously-described embodiments.

Figure 23:
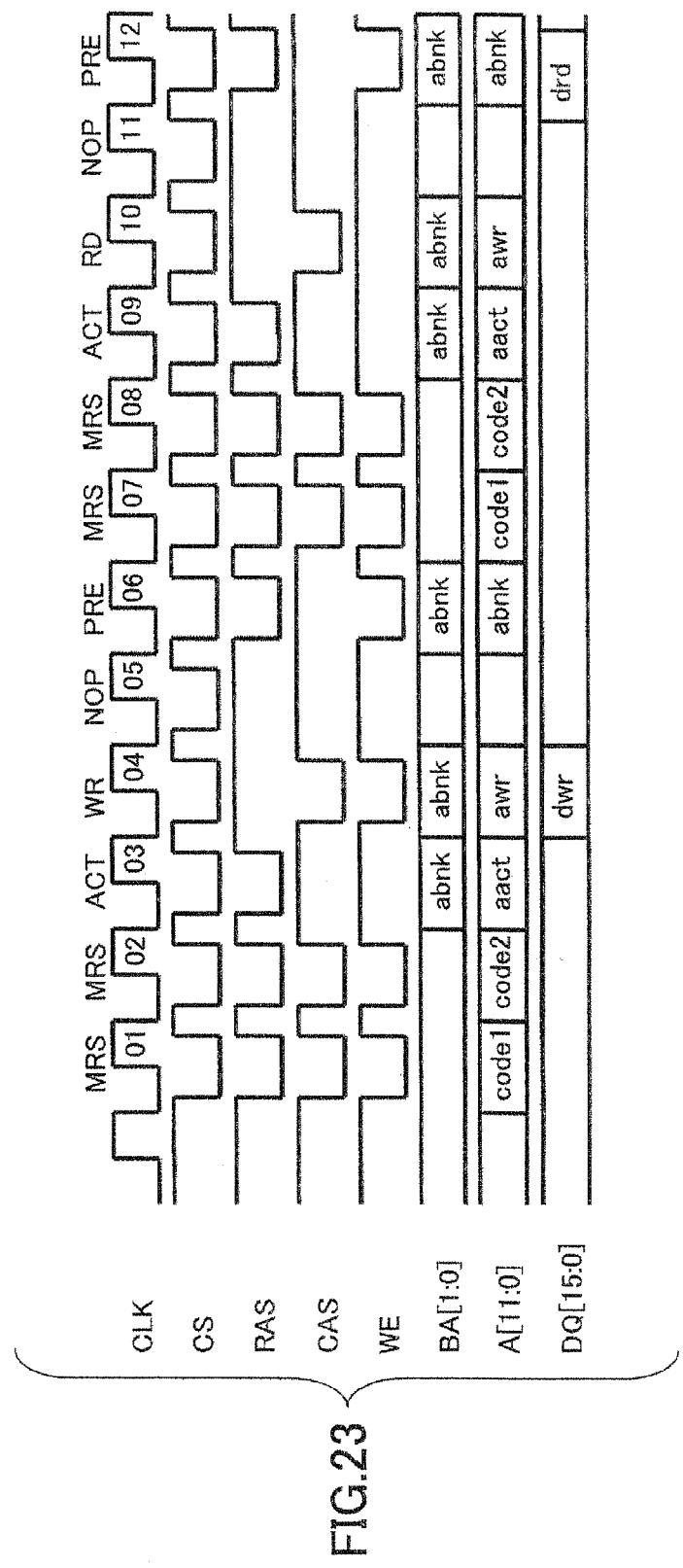
FIG. 23 is a drawing showing a signal input/output sequence with respect to a semiconductor memory device in the case of the code allocation shown in FIG. 22.

FIG. 22 is a drawing showing an example of allocation of codes to terminals when a main code and a sub-code are entered in two steps. In the same manner as in the preceding case, 7-bit main codes and 7-bit sub-codes are used in this case. Since a main code and a sub-code are supplied to the semiconductor memory device at separate timings, the main code and the sub-code can be allocated to the same terminals. In the example shown in FIG. 22, address bits A00 through A06 are allocated to both the main code and the sub-code FIG. 23 is a drawing showing a signal input/output sequence with respect to a semiconductor memory device in the case of the code allocation shown in FIG. 22. At the first clock cycle (01), CS, RAS, CAS, and WE are all set to LOW to enter a register setting command MRS. At the same time, the address signals A[8:0] supplied to the address terminals 11 are used to specify a main code (code1), thereby specifying a test function. Then, CS, RAS, CAS, and WE are all set to LOW to enter a register setting command MRS. At the same time, the address signals A[8:0] supplied to the address terminals 11 are used to specify a sub-code (code2), thereby specifying an option.

CS, RAS, CAS, and WE are then set to L, L, H, and H to enter an activation command ACT. At the same time, a bank address abnk and a row address aact are supplied. Thereafter, CS, RAS, CAS, and WE are set to L, H, L, and L to enter a write command WR. At the same time, a bank address abnk, a column address awr, and a write data dwr are supplied. Through the operation described above, test-purpose data is written to the specified address. Finally, CS, RAS, CAS, and WE are set to L, L, H, and L to enter a precharge command PRE. Through the operations described above, the writing of test-purpose data to the specified address is completed.

At the seventh clock cycle (07), CS, RAS, CAS, and WE are all set to LOW to enter a register setting command MRS. At the same time, the address signals A[8:0] supplied to the address terminals 11 are used to specify a main code (code1), thereby specifying a test function. Then, CS, RAS, CAS, and WE are all set to LOW to enter a register setting command MRS. At the same time, the address signals A[8:0] supplied to the address terminals 11 are used to specify a sub-code (code2), thereby specifying an option.

CS, RAS, CAS, and WE are then set to L, L, H, and H to enter an activation command ACT. At the same time, a bank address abnk and a row address aact are supplied. CS, RAS, CAS, and WE are then set to L, H, L, and H to enter a read command RD. At the same time, a bank address abnk and a column address awr are supplied. Finally, CS, RAS, CAS, and WE are set to L, L, H, and L to enter a precharge command PRE. Read data drd is read after the passage of a predetermined latency following the read command. Through the operations described above, the reading of the test-purpose data from the specified address is completed.

When a main code and a sub-code are entered in two separate steps as described above, one additional process cycle is necessary for each of the write operation and the read operation. In the case of the code allocation as shown in FIG. 22, the number of required terminals is reduced, but the length of time required for test operation undesirably increases.

Figure 24:
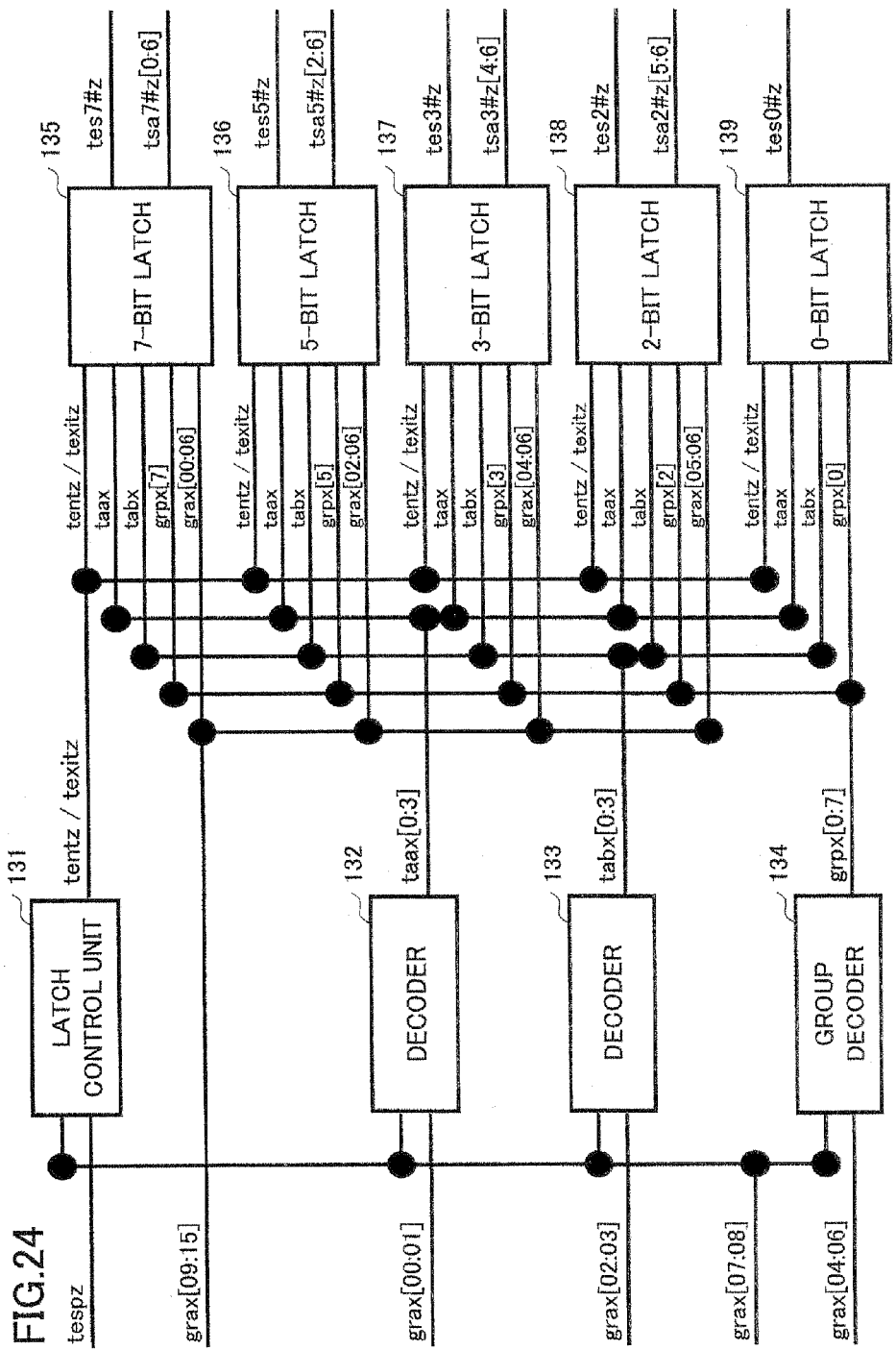
FIG. 24 is a drawing showing the configuration of a test register in the case of the code allocation shown in FIG. 21.

FIG. 24 is a drawing showing the configuration of a test register in the case of the code allocation shown in FIG. 21. A test register shown in FIG. 24 includes a latch control unit 131, a decoder 132, a decoder 133, a group decoder 134, a 7-bit latch 135, a 5-bit latch 136, a 3-bit latch 137, a 2-bit latch 138, and a 0-bit latch 139. Unlike the configuration shown in FIG. 6, the decode outputs of the decoders 132, 133, and 134 are supplied to all the latches. This is because the main codes have a fixed length of 7 bits, and the decode result obtained by decoding a 7-bit main code is used to identify one of the latches. In this manner, the number of signal lines used in the test register is larger than that of the configuration shown in FIG. 6.

Figure 25:
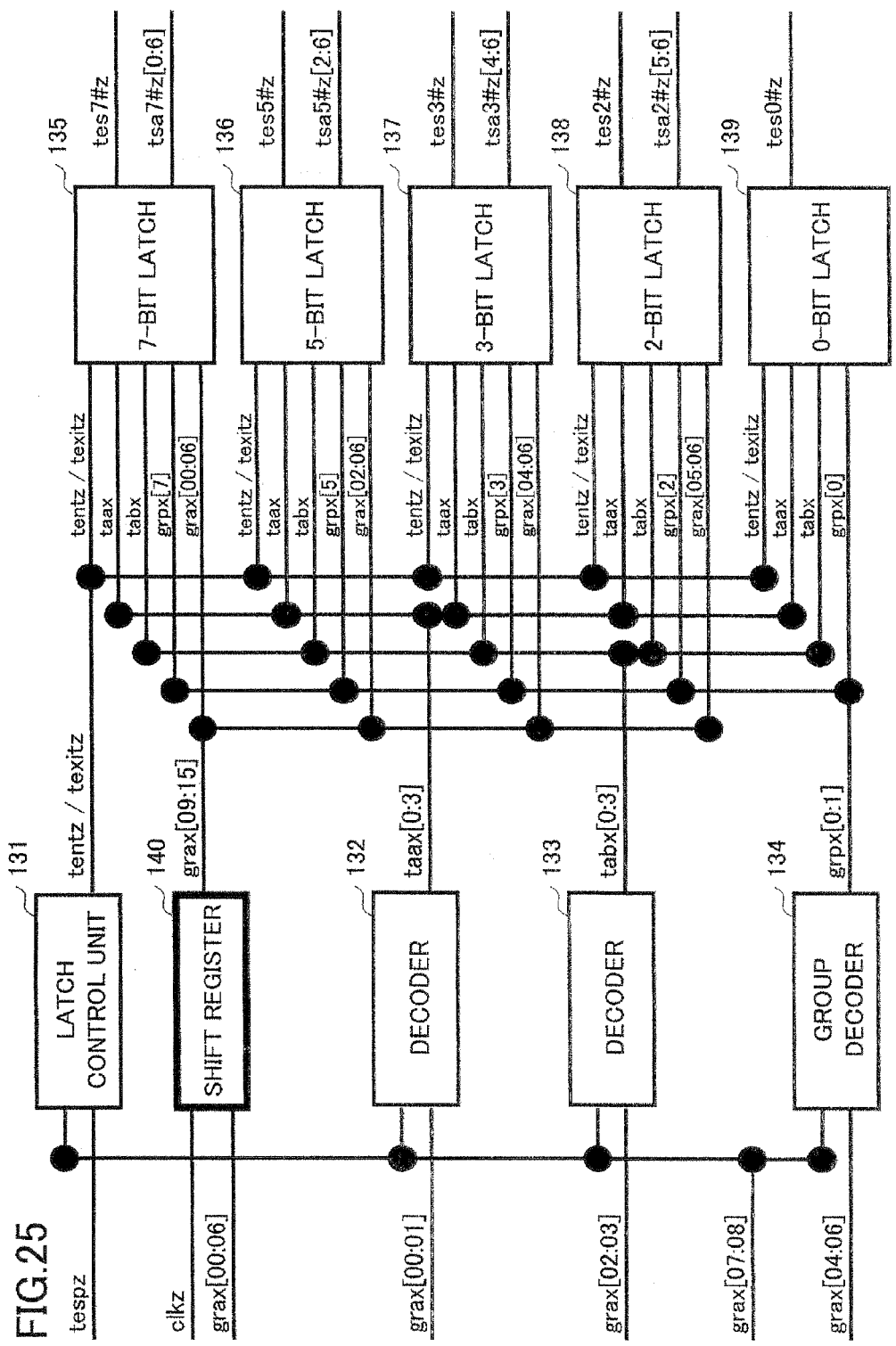
FIG. 25 is a drawing showing the configuration of a test register in the case of the code allocation shown in FIG. 22.

FIG. 25 is a drawing showing the configuration of a test register in the case of the code allocation shown in FIG. 22. A test register shown in FIG. 24 includes a latch control unit 131, a decoder 132, a decoder 133, a group decoder 134, a 7-bit latch 135, a 5-bit latch 136, a 3-bit latch 137, a 2-bit latch 138, a 0-bit latch 139, and a shift register 140. In the case of the code allocation shown in FIG. 22, a main code and a sub-code are supplied to the same terminals at separate timings, so that the shift register 140 is necessary to store the code that is supplied first. In this case, the number of signal lines used in the test register is larger than that of the configuration shown in FIG. 6, and, also, one additional register the same size as the address-bus width becomes necessary.

According to at least one embodiment, an option of each test function is specified (identified) by a sub-code (i.e., the first code noted above). The number of bits of a main code (i.e., the second code and the third code noted above) and the number of bits of the sub-code are designed to vary and be different for different functions according to need. With such variation in the number of bits of the main code and the number of bits of the sub-code, a relatively small number of bits are sufficient to specify a desired number of test functions and a desired number of options. According to at least one embodiment, further, latches (registers) are provided in one-to-one correspondence to test functions. When a main code specifying a test function and a sub-code specifying an option are entered, the latch specified by decoding the entered main code stores the value of the entered sub-code. As described above, the number of bits of the main code is designed to vary and be different for different functions according to need. Accordingly, the number (i.e., the first predetermined number) of bits for uniquely specifying a first latch and the number (i.e., the third predetermined number) of bits for uniquely specifying a second latch may be different. In such a case, the number of decode signal lines for selecting a latch can be reduced with respect to the latches that can be uniquely identified by a reduced number of bits.

The advantages of the above-described embodiments can also be appreciated in a system in which a memory and a memory controller are combined. This is because the number of wire connections connecting between a memory and a memory controller should preferably be a minimum. The advantages of the embodiments are also explicitly appreciated in the testing of semiconductor integrated circuits. When semiconductor integrated circuits such as memories are tested, a plurality of chips are concurrently connected to a tester, and the probe pins of the tester are brought in contact with the terminals of these chips that require signal input/output. Since the number of probe pins of the tester is limited, it is preferable to have a minimum number of terminals that require signal input/output.

Further, the present invention is not limited to these embodiments, but various variations and modifications may be made without departing from the scope of the present invention.

What is claimed is:
1. A semiconductor integrated circuit, comprising:
a plurality of terminals;
a first latch configured to, upon being uniquely specified by a first predetermined number of bits that are part of a plurality of bits entered through the plurality of terminals, store a second predetermined number of bits that are at least part of remaining bits left after excluding the first predetermined number of bits from the plurality of bits; and
a second latch configured to, upon being uniquely specified by a third predetermined number of bits that are part of the plurality of bits entered through the plurality of terminals, store a fourth predetermined number of bits that are at least part of remaining bits left after excluding the third predetermined number of bits from the plurality of bits, wherein the first predetermined number is different from the third predetermined number, and the second predetermined number is different from the fourth predetermined number.

2. The semiconductor integrated circuit as claimed in claim 1, further comprising a core circuit configured to perform an operation responsive to at least one of the second predetermined number of bits stored in the first latch and the fourth predetermined number of bits stored in the second latch.

3. The semiconductor integrated circuit as claimed in claim 2, wherein the first latch and the second latch constitute a test register configured to specify a test function for the semiconductor integrated circuit.

4. The semiconductor integrated circuit as claimed in claim 3, wherein the core circuit includes a memory cell array, and the plurality of terminals are address terminals to which address signals are supplied to specify memory cells in the memory cell array.

5. The semiconductor integrated circuit as claimed in claim 1, wherein the first predetermined number of bits are part of the third predetermined number of bits.

6. The semiconductor integrated circuit as claimed in claim 5, further comprising:
- a first decoder configured to output a first decode signal obtained by decoding the first predetermined number of bits; and
- a second decoder configured to output a second decode signal obtained by decoding remaining bits left after excluding the first predetermined number of bits from the third predetermined number of bits,
- wherein the first latch is uniquely identified by the first decode signal, and the second latch is uniquely identified by the first decode signal and the second decode signal.

* * * * *